(12) United States Patent
Won

(10) Patent No.: US 12,713,669 B2
(45) Date of Patent: Aug. 18, 2026

(54) SEMICONDUCTOR DEVICE

(71) Applicant: Samsung Electronics Co., Ltd., Suwon-si (KR)

(72) Inventor: Seok Jun Won, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 659 days.

(21) Appl. No.: 18/153,733

(22) Filed: Jan. 12, 2023

(65) Prior Publication Data

US 2023/0411454 A1 Dec. 21, 2023

(30) Foreign Application Priority Data

Jun. 21, 2022 (KR) ........................ 10-2022-0075626

(51) Int. Cl.

*H10D 62/10* (2025.01)
*H10D 30/43* (2025.01)
*H10D 62/13* (2025.01)
*H10D 64/01* (2025.01)

(52) U.S. Cl.

CPC ........... *H10D 62/121* (2025.01); *H10D 30/43* (2025.01); *H10D 62/151* (2025.01); *H10D 64/018* (2025.01)

(58) Field of Classification Search

CPC . H10D 62/121; H10D 64/018; H10D 30/6735
See application file for complete search history.

(56) References Cited

U.S. PATENT DOCUMENTS 11,183,561 B2 11/2021 Cheng et al.
11,282,961 B2 3/2022 Frougier et al.
2007/0145498 A1* 6/2007 Metz .................... H10D 62/021 257/E21.431

(Continued)

FOREIGN PATENT DOCUMENTS

KR 10-2019-0078818 A 7/2019
KR 10-2021-0091478 A 7/2021
KR 10-2021-0133843 A 11/2021

OTHER PUBLICATIONS

Morishita et al., "Homoepitaxial growth of AlN layers on freestanding AlN substrate by metalorganic vapor phase epitaxy," J. Cryst. Growth,, Mar. 15, 2014, available online Dec. 25, 2013, 390:46-50.

(Continued)

*Primary Examiner* — Brian Turner
(74) *Attorney, Agent, or Firm* — Fish & Richardson P.C.

(57) ABSTRACT

A semiconductor device includes a substrate, an active pattern on the substrate, the active pattern extending in a first horizontal direction, a first plurality of nanosheets on the active pattern, the first plurality of nanosheets stacked and spaced apart from each other in a vertical direction, and a gate electrode on the active pattern. The gate electrode extends in a second horizontal direction different from the first horizontal direction, and the gate electrode surrounds the first plurality of nanosheets. The semiconductor device includes an inner spacer on at least one side surface of the gate electrode, the inner spacer between adjacent ones of the first plurality of nanosheets, and the inner spacer including a crystalline insulating material.

20 Claims, 28 Drawing Sheets

(56) References Cited

U.S. PATENT DOCUMENTS

| | | | | |
|---|---|---|---|---|
| 2016/0104787 | A1* | 4/2016 | Kittl | H10D 64/017<br>438/283 |
| 2019/0198639 | A1* | 6/2019 | Kim | H10D 30/6757 |
| 2021/0035870 | A1 | 2/2021 | Young et al. | |
| 2021/0036106 | A1* | 2/2021 | Shin | H10D 62/151 |
| 2021/0193818 | A1 | 6/2021 | Yun et al. | |
| 2021/0233818 | A1 | 7/2021 | Ando et al. | |
| 2021/0336020 | A1* | 10/2021 | Yu | H10D 84/013 |
| 2021/0349691 | A1* | 11/2021 | Hekmatshoartabari | H10D 30/6713 |
| 2021/0375664 | A1 | 12/2021 | Chang et al. | |
| 2022/0045193 | A1 | 2/2022 | Xie et al. | |
| 2022/0059533 | A1 | 2/2022 | Bae et al. | |
| 2022/0069135 | A1 | 3/2022 | Chu et al. | |
| 2022/0199775 | A1* | 6/2022 | Park | H10D 30/024 |

OTHER PUBLICATIONS

Office Action in Korean Appln. No. 10-2022-0075626, mailed on Jan. 14, 2026, 12 pages (with machine translation).

* cited by examiner

SEMICONDUCTOR DEVICE

CROSS-REFERENCE TO RELATED APPLICATION

This application claims priority from Korean Patent Application No. 10-2022-0075626 filed on Jun. 21, 2022 in the Korean Intellectual Property Office, and all the benefits accruing therefrom under 35 U.S.C. 119, the contents of which in its entirety are herein incorporated by reference.

FIELD

Some example embodiments relate to a semiconductor device, including a semiconductor device including an MBCFET™ (Multi-Bridge Channel Field Effect Transistor).

BACKGROUND

A scaling scheme for increasing an integration density of an integrated circuit device is to employ a multi-gate transistor in which a silicon body in a shape of a fin or a nanowire is formed on a substrate, and a gate is formed on a surface of the silicon body.

Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress SCE (short channel effect) in which potential of a channel region is affected by drain voltage.

SUMMARY

Some example embodiments provide a semiconductor in which an inner spacer is made of a crystalline insulating material such that a source/drain region epitaxially grows from the inner spacer, thereby inhibiting or preventing formation of a void between the inner spacer and the source/drain region.

According to some example embodiments of the inventive concepts, a semiconductor device includes a substrate, an active pattern on the substrate, the active pattern extending in a first horizontal direction, a first plurality of nanosheets on the active pattern, the first plurality of nanosheets stacked and spaced apart from each other in a vertical direction, a gate electrode on the active pattern, the gate electrode extending in a second horizontal direction different from the first horizontal direction, and the gate electrode surrounding the first plurality of nanosheets, and an inner spacer on at least one side surface of the gate electrode, the inner spacer between adjacent ones of the first plurality of nanosheets, and the inner spacer including a crystalline insulating material.

According to some example embodiments of the inventive concepts, a semiconductor device includes a substrate, an active pattern on the substrate, the active pattern extending in a first horizontal direction, a plurality of nanosheets on the active pattern, the plurality of nanosheets stacked and spaced apart from each other in a vertical direction, a source/drain region on at least one side surface of the plurality of nanosheets, and an inner spacer contacting the source/drain region between adjacent ones of the plurality of nanosheets, the inner spacer including a crystalline insulating material.

According to some example embodiments of the inventive concepts, a semiconductor device includes a substrate, an active pattern on the substrate, the active pattern extending in a first horizontal direction, a plurality of nanosheets on the active pattern, the plurality of nanosheets stacked and spaced apart from each other in a vertical direction, a gate electrode on the active pattern, the gate electrode extending in a second horizontal direction different from the first horizontal direction, and the gate electrode surrounding the plurality of nanosheets, a source/drain region on at least one side surface of the gate electrode, and an inner spacer between the gate electrode and the source/drain region, the inner spacer contacting the source/drain region, and the inner spacer including crystalline aluminum nitride (AlN).

Example embodiments of the inventive concepts are not limited to the above-mentioned purposes. Other example purposes and advantages according to the inventive concepts that are not mentioned may be understood based on the following descriptions, and may be more clearly understood based on example embodiments according to the inventive concepts.

BRIEF DESCRIPTION OF DRAWINGS

The above and other example features of the inventive concepts will become more apparent by describing in detail example embodiments thereof with reference to the attached drawings, in which.

DETAILED DESCRIPTIONS

Hereinafter, a semiconductor device according to some example embodiments of the inventive concepts will be described with reference to FIG. 1 to FIG. 4.

Figure 1:
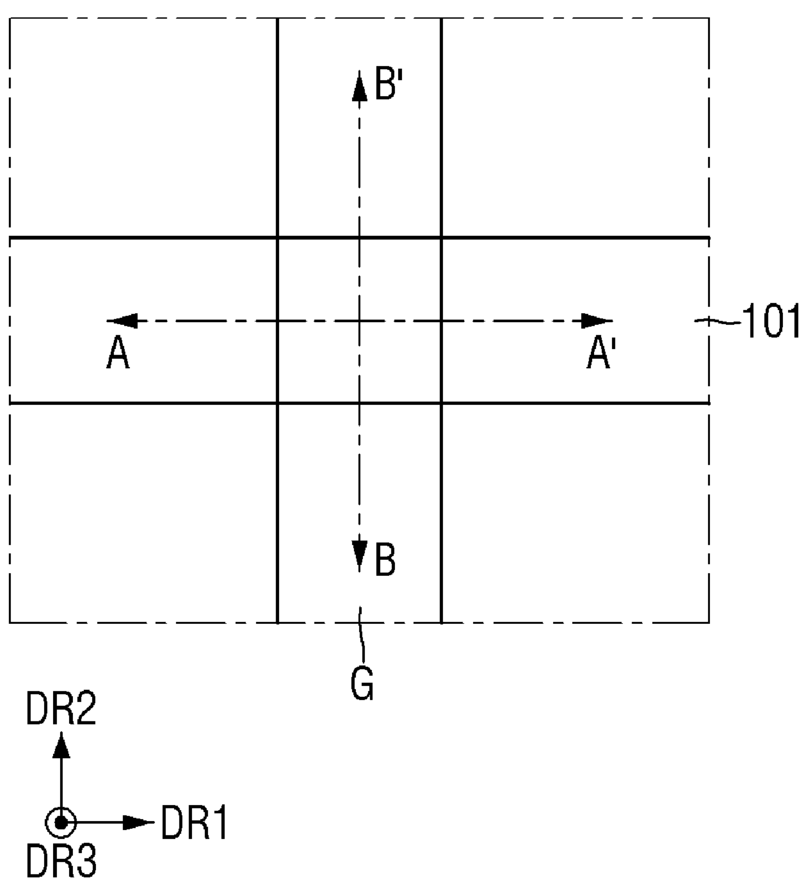
FIG. 1 is a schematic layout diagram for illustrating a semiconductor device according to some example embodiments of the inventive concepts.
Figure 2:
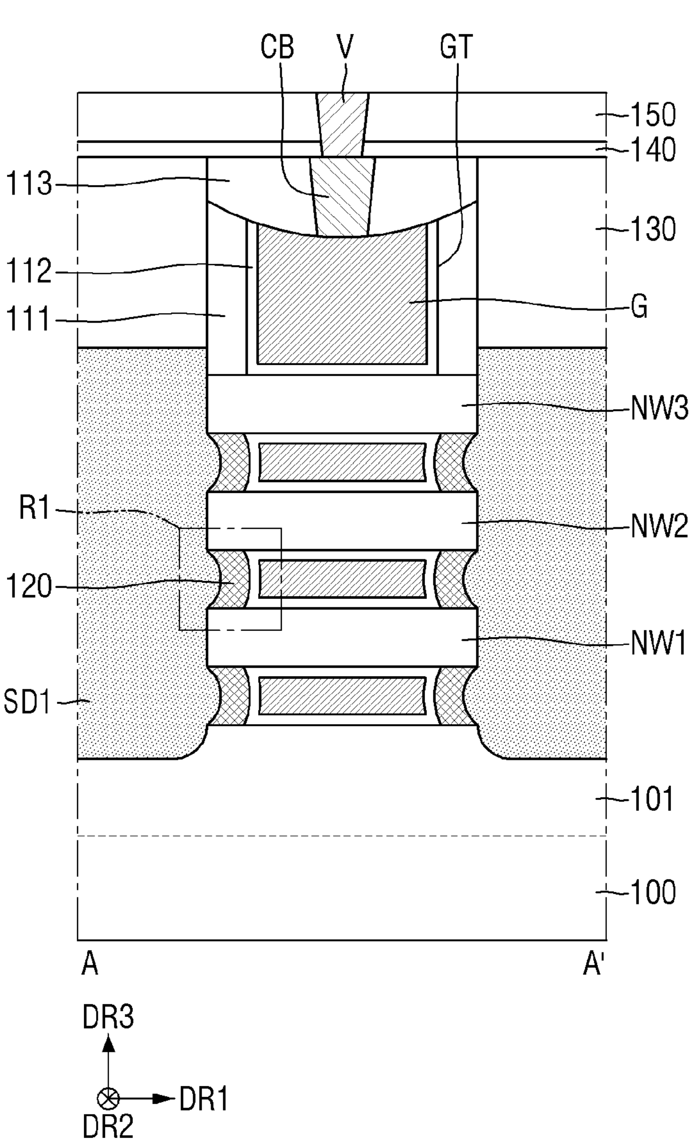
FIG. 2 is a cross-sectional view taken along a line A-A' in FIG. 1.
Figure 3:
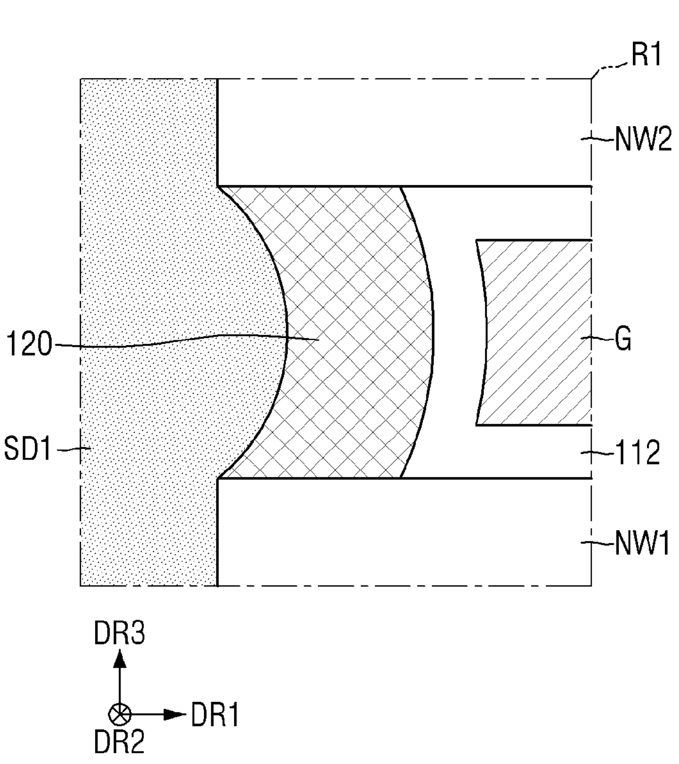
FIG. 3 is an enlarged view of a R1 region of FIG. 2.
Figure 4:
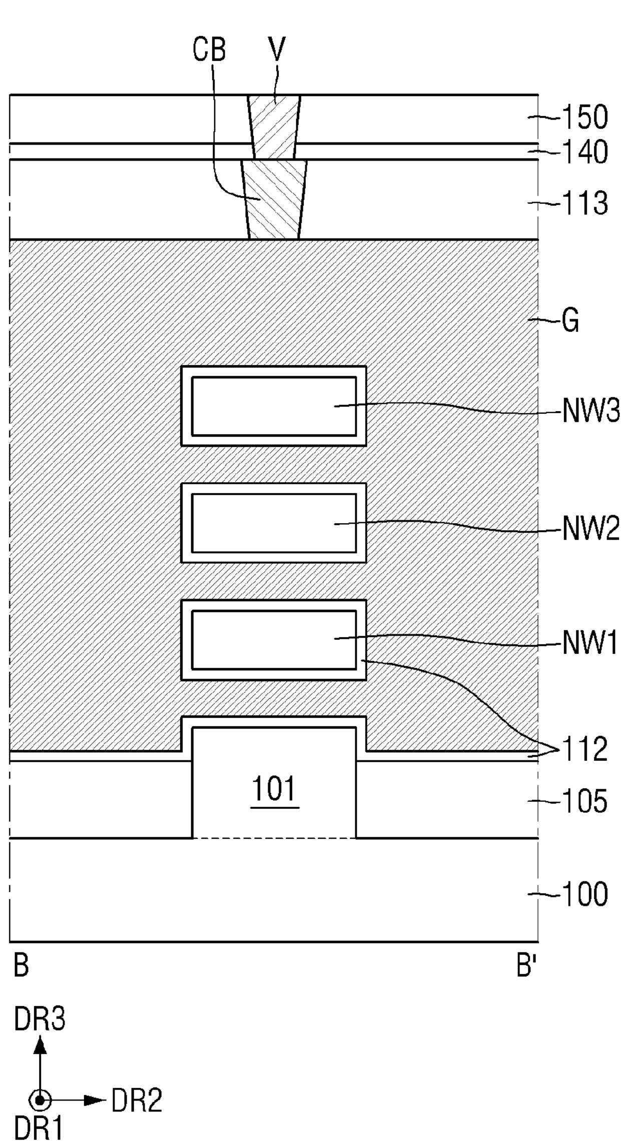
FIG. 4 is a cross-sectional view taken along a line B-B' in FIG. 1.

FIG. 1 is a schematic layout diagram for illustrating a semiconductor device according to some example embodiments of the inventive concepts. FIG. 2 is a cross-sectional view taken along a line A-A' in FIG. 1. FIG. 3 is an enlarged view of the R1 region of FIG. 2. FIG. 4 is a cross-sectional view taken along a line B-B' in FIG. 1.

Referring to FIG. 1 to FIG. 4, the semiconductor device according to some example embodiments of the inventive concepts includes a substrate 100, an active pattern 101, a field insulating layer 105, a plurality of nanosheets NW1, NW2, and NW3, a gate electrode G, a gate spacer 111, a gate insulating layer 112, a capping pattern 113, an inner spacer 120, a source/drain region SD1, a first interlayer insulating layer 130, a gate contact CB, an etch stop layer 140, a second interlayer insulating layer 150, and a via V.

The substrate 100 may be embodied as a silicon substrate or an SOI (silicon-on-insulator). Alternatively, the substrate 100 may include silicon germanium, SGOI (silicon germanium on insulator), indium antimonide, lead telluride, indium arsenide, indium phosphide, gallium arsenide or gallium antimonide. However, the example embodiments are not limited thereto.

The active pattern 101 may protrude from the substrate 100 in a vertical direction DR3. In this regard, the vertical direction DR3 may be defined as a direction perpendicular or substantially perpendicular to each of a first horizontal direction DR1 and a second horizontal direction DR2 different from the first horizontal direction DR1. The active pattern 101 may be a portion of the substrate 100, or may include an epitaxial layer grown from the substrate 100. The active pattern 101 may extend in the first horizontal direction DR1.

The field insulating layer 105 may be disposed on the substrate 100. The field insulating layer 105 may surround a sidewall of the active pattern 101. For example, an upper surface of the active pattern 101 may protrude in the vertical direction DR3 beyond an upper surface of the field insulating layer 105. However, the example embodiments are not limited thereto. In some example embodiments, the upper surface of the active pattern 101 may be coplanar or substantially coplanar with the upper surface of the field insulating layer 105.

The plurality of nanosheets NW1, NW2, and NW3 may be disposed on the active pattern 101. The plurality of nanosheets NW1, NW2, and NW3 may be disposed in a region where the active pattern 101 and the gate electrode G intersect each other. The plurality of nanosheets NW1, NW2, and NW3 may include a plurality of nanosheets stacked on top of each other and spaced apart from each other in the vertical direction DR3.

For example, the plurality of nanosheets NW1, NW2, and NW3 may include first to third nanosheets NW1, NW2, and NW3.

The first to third nanosheets NW1, NW2, and NW3 may be sequentially stacked on the active pattern 101 and may be spaced apart from each other. For example, the first nanosheet NW1 may be disposed on the active pattern 101 and be spaced apart from the active pattern 101 in the vertical direction DR3. The second nanosheet NW2 may be spaced apart from the first nanosheet NW1 in the vertical direction DR3 while being disposed on the first nanosheet NW1. The third nanosheet NW3 may be spaced apart from the second nanosheet NW2 in the vertical direction DR3 while being disposed on the second nanosheet NW2. Each of the first to third nanosheets NW1, NW2, and NW3 may include, for example, silicon (Si) or silicon germanium (SiGe). Hereinafter, an example embodiment in which each of the first to third nanosheets NW1, NW2, and NW3 includes silicon (Si) will be described.

In FIG. 2 and FIG. 4, it is illustrated that the plurality of nanosheets NW1, NW2, and NW3 include three nanosheets stacked on top of each other and spaced apart from each other in the vertical direction DR3. However, this is for convenience of illustration, and the example embodiments are not limited thereto. In some example embodiments, the plurality of nanosheets NW1, NW2, and NW3 may include four or more nanosheets stacked on top of each other and spaced apart from each other in the vertical direction DR3.

The gate spacer 111 may extend in the second horizontal direction DR2 while being disposed on the field insulating layer 105 and the third nanosheet NW3 which is the uppermost nanosheet among the plurality of nanosheets NW1, NW2, and NW3. The gate spacer 111 may include two spacers spaced apart from each other in the first horizontal direction DR1. A gate trench GT may be defined between the two spacers of the gate spacer 111.

The gate spacer 111 may include, for example, at least one of silicon nitride (SiN), silicon oxynitride (SiON), silicon oxide ($SiO_2$), silicon oxycarbonitride (SiOCN), silicon boron nitride (SiBN), silicon oxyboronnitride (SiOBN), silicon oxycarbide (SiOC) or combinations thereof, but example embodiments are not limited thereto.

The gate electrode G may extend in the second horizontal direction DR2 while being disposed on the active pattern 101 and the field insulating layer 105. The gate electrode G may be received inside the gate trench GT. Further, the gate electrode G may surround the plurality of nanosheets NW1, NW2, and NW3.

The gate electrode G may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. The example embodiments are not limited thereto. The gate electrode G may include a conductive metal oxide, a conductive metal oxynitride, and the like or may include oxidized products of the above-mentioned materials.

The source/drain region SD1 may be disposed on at least one side surface of the gate electrode G while being disposed on the active pattern 101. For example, the source/drain region SD1 may be disposed on both opposing side surfaces in the first horizontal direction DR1 of the gate electrode G while being disposed on the active pattern 101. The source/drain region SD1 may be disposed on at least one side surface of each of the plurality of nanosheets NW1, NW2, and NW3 while being disposed on the active pattern 101. For example, the source/drain region SD1 may be disposed on both opposing side surfaces in the first horizontal direction DR1 of each of the plurality of nanosheets NW1, NW2, and NW3 while being disposed on the active pattern 101. The source/drain region SD1 may contact the plurality of nanosheets NW1, NW2, and NW3.

The gate insulating layer 112 may be disposed along a sidewall and a bottom surface of the gate trench GT. That is, the gate insulating layer 112 may be disposed between the gate electrode G and the gate spacer 111 while being received inside the gate trench GT. The gate insulating layer 112 may be disposed between the gate electrode G and the field insulating layer 105. The gate insulating layer 112 may be disposed between the gate electrode G and the plurality of nanosheets NW1, NW2, and NW3. The gate insulating layer 112 may be disposed between the gate electrode G and the active pattern 101. The gate insulating layer 112 may be disposed between the gate electrode G and the source/drain region SD1.

The gate insulating layer 112 may include at least one of silicon oxide, silicon oxynitride, silicon nitride, or a high dielectric constant (high-k) material having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but example embodiments are not limited thereto.

The semiconductor device according to some example embodiments may include an NC (negative capacitance) FET using a negative capacitor. For example, the gate insulating layer 112 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example embodiment, hafnium zirconium oxide may refer to a material obtained by doping hafnium oxide with zirconium (Zr). In another example embodiment, hafnium zirconium oxide may refer to a compound of hafnium (Hf), zirconium (Zr), and oxygen (O). Example embodiments are not limited to these materials.

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn), but example embodiments are not limited thereto. A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y), but example embodiments are not limited thereto.

When the dopant is aluminum (Al), the ferroelectric material film may include aluminum having an atomic % in a range of about 3 to about 8 at % (atomic %) of aluminum. In this connection, a content of the dopant may be a content of aluminum based on a sum of hafnium and aluminum.

When the dopant is silicon (Si), the ferroelectric material film may include silicon having an atomic % in a range of about 2 to about 10 at % of silicon. When the dopant is yttrium (Y), the ferroelectric material film may include yttrium having an atomic % in a range of about 2 to about 10 at % yttrium. When the dopant is gadolinium (Gd), the ferroelectric material film may include gadolinium having an atomic % in a range of about 1 to about 7 at % gadolinium. When the dopant is zirconium (Zr), the ferroelectric material film may include zirconium having an atomic % in a range of about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the example embodiments are not limited thereto.

The ferroelectric material film and the paraelectric material film may include the same or substantially the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the example embodiments are not limited thereto. Because a critical thickness exhibiting the ferroelectric properties may vary based on a type of the ferroelectric material, the thickness of the ferroelectric material film may vary depending on the type of the ferroelectric material.

In one example embodiment, the gate insulating layer 112 may include one ferroelectric material film. In another example embodiment, the gate insulating layer 112 may include a stack of a plurality of ferroelectric material films spaced apart from each other. The gate insulating layer 112 may have a stack film structure in which a plurality of ferroelectric material films and a plurality of paraelectric material films are alternately stacked on top of each other.

The capping pattern 113 may extend in the second horizontal direction DR2 while being disposed on the gate electrode G and the gate spacer 111. For example, the capping pattern 113 may contact an upper surface of the gate spacer 111. However, the example embodiments are not limited thereto. In some example embodiments, the capping pattern 113 may be disposed between the gate spacers 111. In some example embodiments, the upper surface of the capping pattern 113 may be coplanar with the upper surface of the gate spacer 111.

The capping pattern 113 may include, for example, at least one of silicon nitride (SiN), silicon oxynitride (SiON), silicon oxide ($SiO_2$), silicon carbonitride (SiCN), silicon oxycarbonitride (SiOCN), or combinations thereof, but example embodiments are not limited thereto.

The inner spacer 120 may be disposed between adjacent ones of the plurality of nanosheets NW1, NW2, and NW3. For example, the inner spacers 120 may be disposed between the active pattern 101 and the first nanosheet NW1, between the first nanosheet NW1 and the second nanosheet NW2, and between the second nanosheet NW2 and the third nanosheet NW3, respectively. The inner spacer 120 may be disposed on at least one side surface of the gate electrode G. For example, the inner spacer 120 may be disposed on both opposing side surfaces in the first horizontal direction DR1 of the gate electrode G. The inner spacer 120 may be disposed between the gate electrode G and the source/drain region SD1.

The inner spacer 120 may contact the active pattern 101 and each of the plurality of nanosheets NW1, NW2, and NW3 while being disposed on both opposing sidewalls of the gate electrode G. For example, the inner spacer 120 may contact an upper surface of the active pattern 101, a bottom surface and an upper surface of the first nanosheet NW1, a bottom surface and an upper surface of the second nanosheet NW2, and a bottom surface of the third nanosheet NW3. The inner spacer 120 may contact the source/drain region SD1. The inner spacer 120 may come into contact with the gate insulating layer 112.

For example, a first sidewall of the inner spacer 120 facing the gate electrode G may be convex toward the gate electrode G. Further, a second sidewall of the inner spacer 120 in contact with the source/drain region SD1 may be convex toward the gate electrode G. That is, at least a portion of the source/drain region SD1 in contact with the inner spacer 120 may be disposed between the active pattern 101 and the first nanosheet NW1, and between adjacent ones of the nanosheets NW1, NW2, and NW3. However, the example embodiments are not limited thereto.

In some example embodiments, the inner spacer 120 may include a crystalline insulating material. For example, the inner spacer 120 may include crystalline aluminum nitride (AlN). In some example embodiments, for example, the inner spacer 120 may include crystalline silicon nitride (SiN) or crystalline silicon oxynitride (SiON). In some example embodiments, the inner spacer 120 may include amorphous aluminum nitride (AlN).

For example, the crystalline silicon nitride (SiN) may mean a crystal structure in which silicon (Si) is doped with nitrogen (N). The crystalline silicon nitride (SiN) in which nitrogen (N) is doped into silicon (Si) may have a different crystal structure from that of the amorphous silicon nitride (SiN). Further, for example, the crystalline silicon oxynitride (SiON) may mean a crystal structure in which silicon (Si) is doped with oxygen (O) and nitrogen (N). The crystalline silicon oxynitride (SiON) in which silicon (Si) is doped with oxygen (O) and nitrogen (N) may have a different crystal structure from that of the amorphous silicon oxynitride (SiON).

When the inner spacer includes an amorphous insulating material, the source/drain region is not epitaxially grown from the inner spacer in a process of forming the source/drain region, but the source/drain region epitaxially grown from each of the active pattern and the nanosheets may be formed on an exposed surface of this inner spacer. In some example embodiments, a problem in which a void is generated between the inner spacer and the source/drain region may occur.

However, when the inner spacer includes a crystalline insulating material, the source/drain region may be epitaxially grown from each of the active pattern, the nanosheets, and the inner spacer in the process of forming the source/drain region. That is, when the inner spacer includes the crystalline insulating material, the source/drain region may be epitaxially grown from the inner spacer. Thus, the formation of the void between the inner spacer and the source/drain region may be inhibited or prevented.

In the semiconductor device according to some example embodiments of the inventive concepts, the inner spacer 120 may include the crystalline insulating material including at least one of crystalline aluminum nitride (AlN), crystalline silicon nitride (SiN), and crystalline silicon oxynitride (SiON). Thus, in the semiconductor device according to some example embodiments of the inventive concepts, the source/drain region SD1 may be epitaxially grown from the inner spacer 120, thereby inhibiting or preventing the void from being formed between the inner spacer 120 and the source/drain region SD1, thereby improving reliability of the semiconductor device.

For example, the inner spacer 120 may be formed as a single layer. However, the example embodiments are not limited thereto. In some example embodiments, the inner spacer 120 may be formed as a stack of at least two films.

The first interlayer insulating layer 130 may be disposed on the field insulating layer 105. The first interlayer insulating layer 130 may cover the source/drain region SD1. The first interlayer insulating layer 130 may surround a sidewall of the gate spacer 111. For example, an upper surface of the first interlayer insulating layer 130 may be coplanar or substantially coplanar with an upper surface of the capping pattern 113. However, the example embodiments are not limited thereto.

The first interlayer insulating layer 130 may include, for example, at least one of silicon oxide, silicon nitride, silicon oxynitride, and a low-k material. The low-k material may include, for example, fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutoxysiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the example embodiments are not limited thereto.

The gate contact CB may be disposed on the gate electrode G. The gate contact CB may extend through the capping pattern 113 in the vertical direction DR3 and then be connected to the gate electrode G. For example, an upper surface of the gate contact CB may be coplanar or substantially coplanar with an upper surface of the first interlayer insulating layer 130. However, the example embodiments are not limited thereto. Although FIG. 2 and FIG. 4 illustrate that the gate contact CB is formed as a single film, this is for convenience of illustration, and the example embodiments are not limited thereto. That is, the gate contact CB may be formed as a multilayer. The gate contact CB may include a conductive material.

The etch stop layer 140 may be disposed on an upper surface of each of the first interlayer insulating layer 130 and the capping pattern 113. The etch stop layer 140 may be formed conformally, for example. Although FIG. 2 and FIG. 4 illustrate that the etch stop layer 140 is formed as a single film, the example embodiments are not limited thereto. In some example embodiments, the etch stop layer 140 may be formed as a multilayer. The etch stop layer 140 may include, for example, at least one of aluminum oxide, aluminum nitride, hafnium oxide, zirconium oxide, silicon oxide, silicon nitride, silicon oxynitride and a low-k material.

The second interlayer insulating layer 150 may be disposed on the etch stop layer 140. The second interlayer insulating layer 150 may include, for example, at least one of silicon oxide, silicon nitride, silicon oxynitride, and a low-k material.

The via V may extend through the second interlayer insulating layer 150 and the etch stop layer 140 in the vertical direction DR3 and then may be connected to the gate contact CB. FIG. 2 and FIG. 4 illustrate that the via V is formed as a single film. However, this is for convenience of illustration, and the example embodiments are not limited thereto. That is, the via V may be formed as a multilayer. The via V may include a conductive material.

Hereinafter, a method for manufacturing a semiconductor device according to some example embodiments of the inventive concepts will be described with reference to FIG. 5 to FIG. 18.

FIG. 5 to FIG. 18 are diagrams of intermediate structures corresponding to steps for illustrating a method for manufacturing a semiconductor device according to some example embodiments of the inventive concepts.

Figure 5:
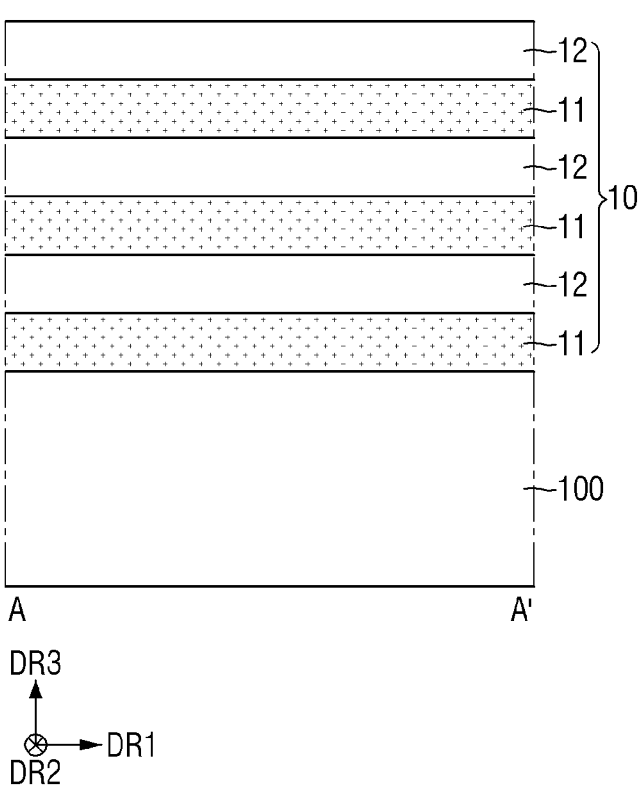
FIG. 5, 6, 7, 8, 9, 10, 11, 12, 13, 14, 15, 16, 17 and FIG. 18 are diagrams of intermediate structures corresponding to steps for illustrating a method for manufacturing a semiconductor device according to some example embodiments of the inventive concepts.

Referring to FIG. 5, a stack structure 10 may be formed on the substrate 100. The stack structure 10 may include sacrificial layers 11 and semiconductor layers 12 disposed on the substrate 100 and alternately stacked on top of each other. For example, the sacrificial layer 11 may constitute the bottommost portion of the stack structure 10, and the semiconductor layer 12 may constitute the uppermost portion of the stack structure 10. However, the example embodiments are not limited thereto. In some example embodiments, the sacrificial layer 11 may constitute the uppermost portion of the stack structure 10. The sacrificial layer 11 may include, for example, silicon germanium (SiGe). The semiconductor layer 12 may include, for example, silicon (Si).

Figure 6:
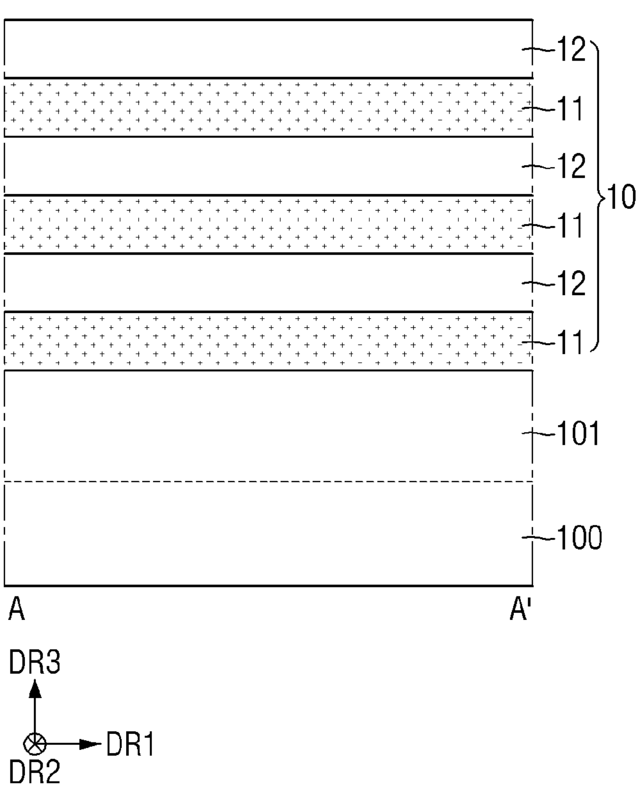
Figure 7:
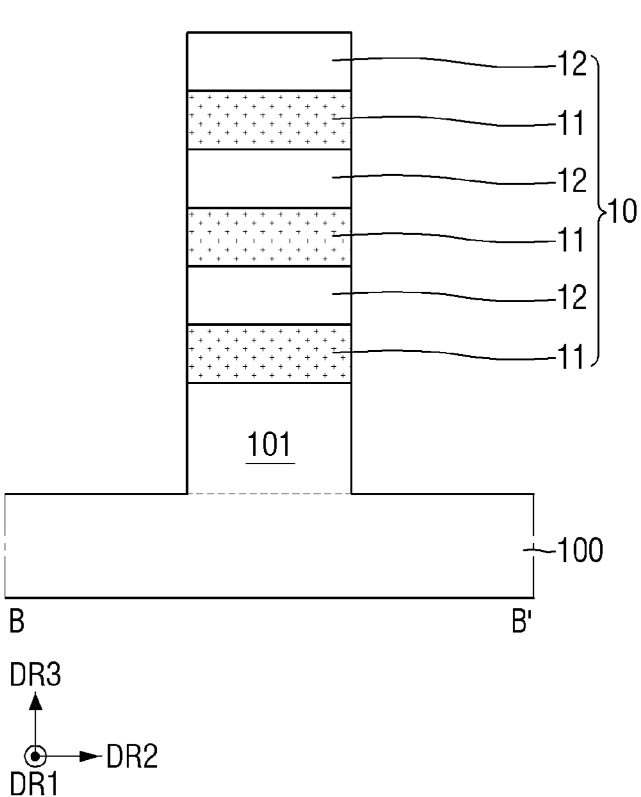

Referring to FIG. 6 and FIG. 7, a portion of the stack structure 10 may be etched. A portion of the substrate 100 may be etched while the stack structure 10 is being etched. In this etching process, the active pattern 101 may be defined under the stack structure 10 while being disposed on the substrate 100. The active pattern 101 may extend in the first horizontal direction DR1.

Figure 8:
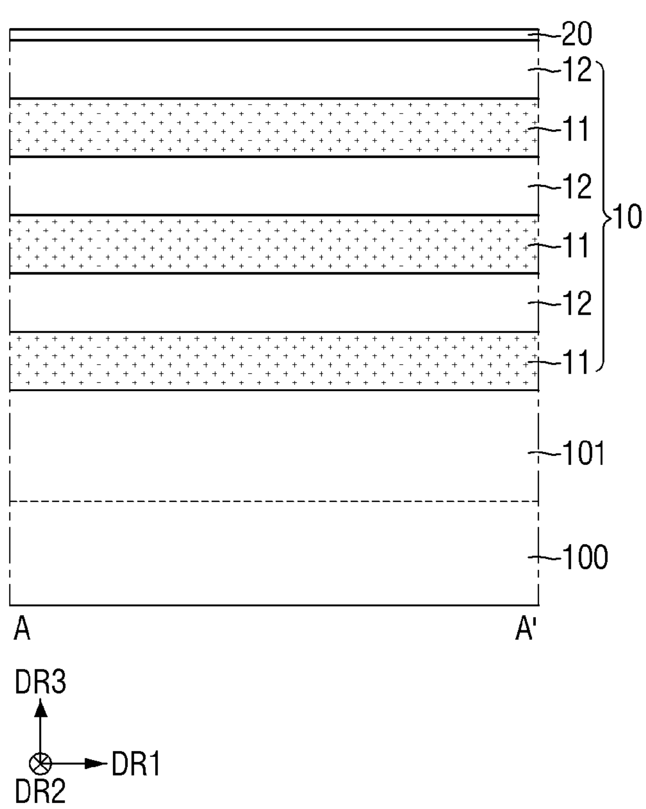
Figure 9:
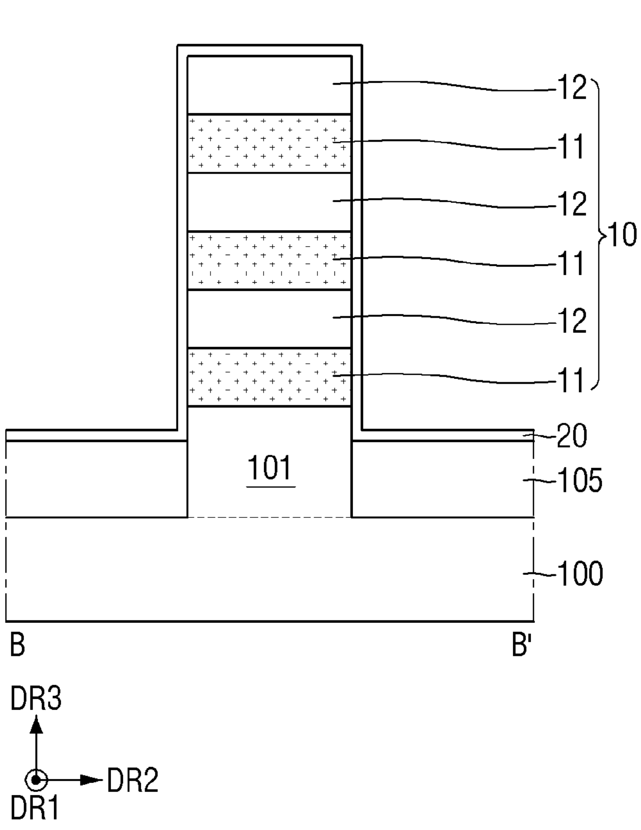

Referring to FIG. 8 and FIG. 9, the field insulating layer 105 surrounding a sidewall of the active pattern 101 may be formed. For example, a vertical level of the upper surface of the active pattern 101 may be higher than that of the upper surface of the field insulating layer 105. Subsequently, a pad oxide layer 20 may be formed to cover the upper surface of the field insulating layer 105, an exposed sidewall of the active pattern 101, and a sidewall and an upper surface of the stack structure 10. For example, the pad oxide layer 20 may be conformally formed. The pad oxide layer 20 may include, for example, silicon oxide ($SiO_2$).

Figure 10:
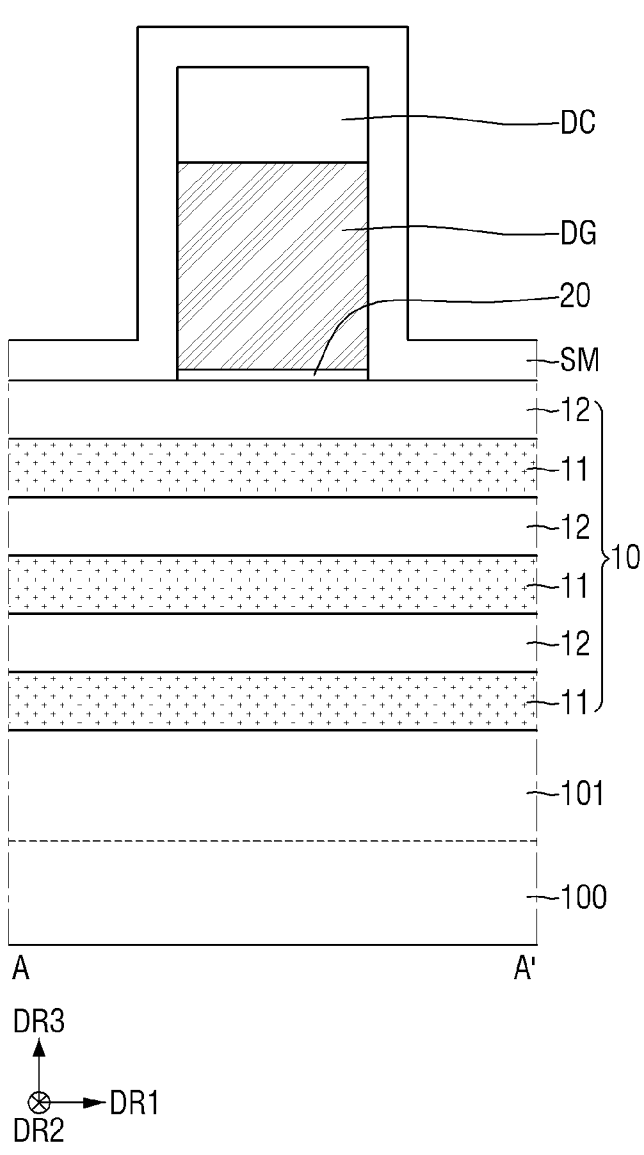
Figure 11:
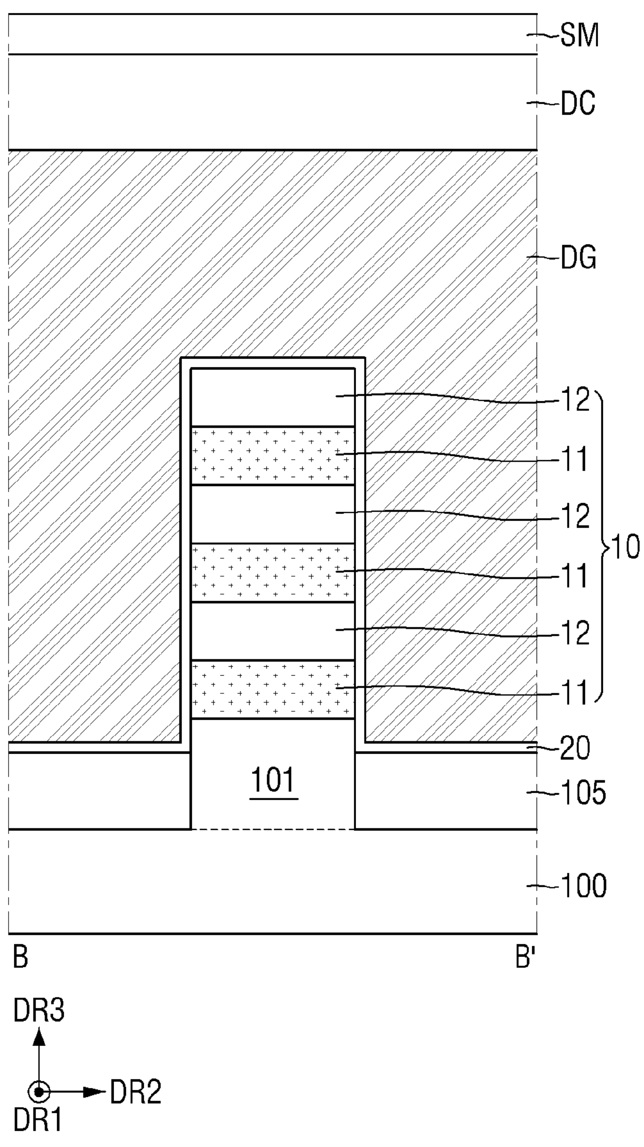

Referring to FIG. 10 and FIG. 11, a dummy gate DG and a dummy capping pattern DC extending in the second horizontal direction DR2 may be formed on the pad oxide layer 20 while being disposed on the stack structure 10 and the field insulating layer 105. The dummy capping pattern DC may be formed on the dummy gate DG. While the dummy gate DG and the dummy capping pattern DC are formed, a remaining portion of the pad oxide layer 20 except for a portion thereof overlapping the dummy gate DG in the vertical direction DR3 on the substrate 100 may be removed.

Subsequently, a spacer material layer SM may be formed to cover a sidewall of the dummy gate DG, a sidewall and an upper surface of the dummy capping pattern DC, and an exposed sidewall and upper surface of the stack structure 10. Although not shown, the spacer material layer SM may also be formed on an exposed upper surface of the field insulating layer 105. For example, the spacer material layer SM may be formed conformally. The spacer material layer SM may include, for example, at least one of silicon nitride (SiN), silicon oxycarbonitride (SiOCN), silicon boron carbonitride (SiBCN), silicon carbonitride (SiCN), silicon oxynitride (SiON) and combinations thereof, but example embodiments are not limited thereto.

Figure 12:
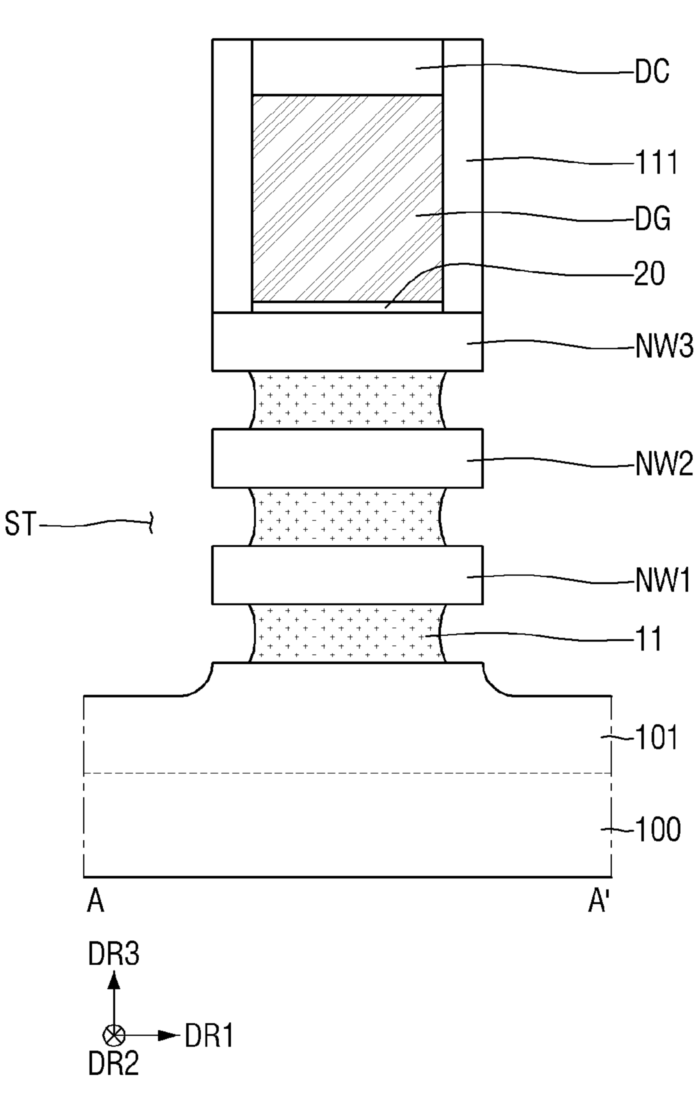

Referring to FIG. 12, a source/drain trench ST may be formed by etching the stack structure (e.g., 10 of FIG. 10) using the dummy capping pattern DC and the dummy gate DG as a mask. For example, the source/drain trench ST may extend into the active pattern 101.

While the source/drain trench ST is formed, a portion of the spacer material layer SM formed on an upper surface of the dummy capping pattern DC, and a portion of the dummy capping pattern (e.g., DC of FIG. 10) may be removed. Thus, the spacer material layer (e.g., SM in FIG. 10) remaining on a sidewall of each of the dummy gate DG and the dummy capping pattern DC may be defined as the gate spacer 111. The semiconductor layer (e.g., 12 in FIG. 10) remaining under the dummy gate DG after the source/drain trench ST is formed may be defined as the first to third nanosheets NW1, NW2, and NW3.

While the source/drain trench ST is formed, a portion of each of both opposing sidewalls of the sacrificial layer 11 may be removed. For example, during the formation of the source/drain trench ST, a portion of each of both opposing sidewalls in the first horizontal direction DR1 of the sacrificial layer 11 between the active pattern 101 and the first nanosheet NW1, between the first nanosheet NW1 and the second nanosheet NW2, and between the second nanosheet NW2 and the third nanosheet NW3, respectively may be removed. Accordingly, each of both opposing sidewalls in the first horizontal direction DR1 of the sacrificial layer 11 may be formed to be recessed inwardly from each of both opposing sidewalls in the first horizontal direction DR1 in each of the first to third nanosheets NW1, NW2, and NW3.

Figure 13:
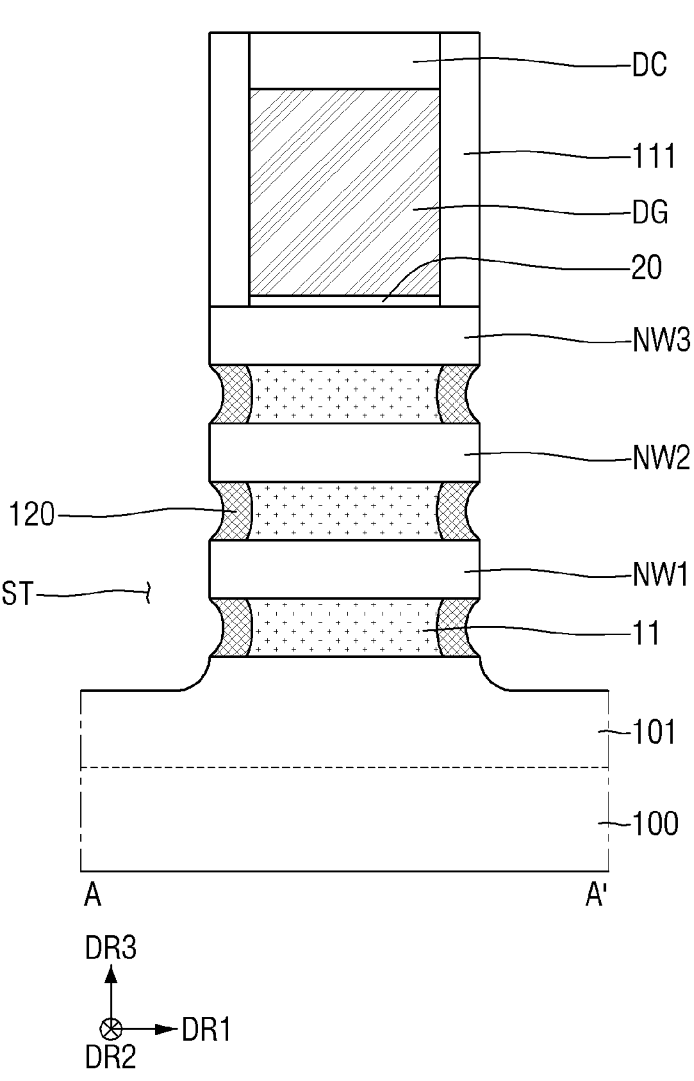

Referring to FIG. 13, the inner spacer 120 may be formed in a space obtained via the removal of the portion of each of both opposing sidewalls in the first horizontal direction DR1 of the sacrificial layer 11. For example, the inner spacer 120 may be formed on each of both opposing sidewalls in the first horizontal direction DR1 of the remaining sacrificial layer 11 and between the active pattern 101 and the first nanosheet NW1, between the first nanosheet NW1 and the second nanosheet NW2, between the second nanosheet NW2 and the third nanosheet NW3, respectively.

For example, a sidewall of the inner spacer 120 exposed to the source/drain trench ST may be formed to be recessed inwardly from each of both opposing sidewalls in the first horizontal direction DR1 of each of the first to third nanosheets NW1, NW2, and NW3. For example, the inner spacer 120 may include at least one of crystalline aluminum nitride (AlN), crystalline silicon nitride (SiN), and crystalline silicon oxynitride (SiON).

Figure 14:
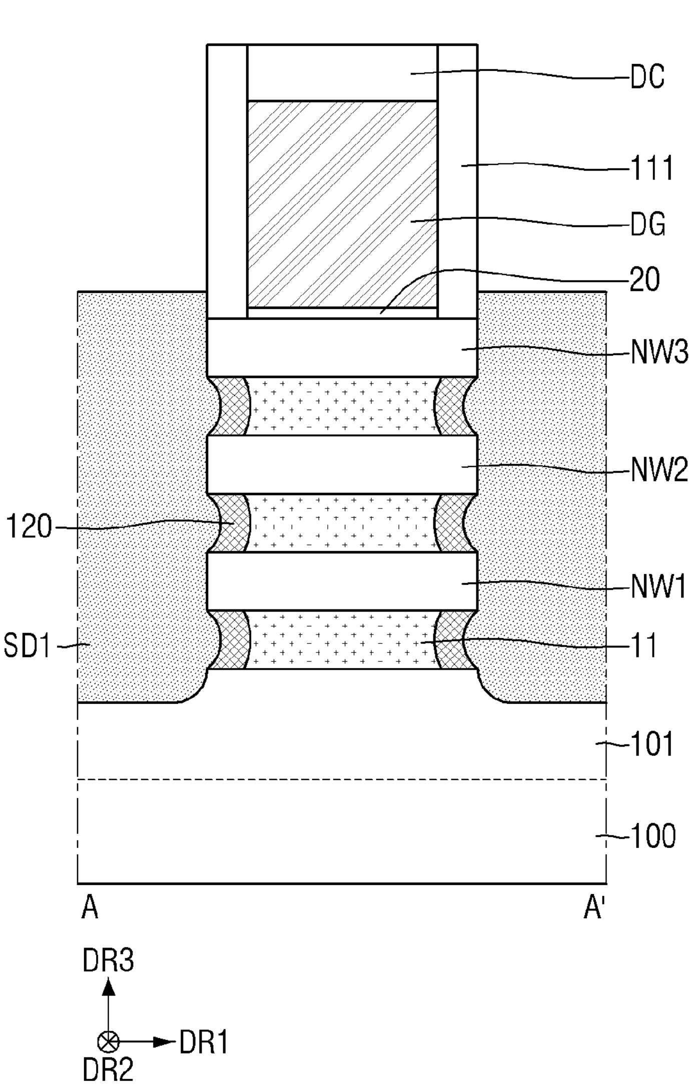

Referring to FIG. 14, the source/drain region SD1 may be formed inside the source/drain trench (e.g., ST of FIG. 13). For example, the source/drain region SD1 may be epitaxially grown from a portion of each of the active pattern 101, the first to third nanosheets NW1, NW2, and NW3 and the inner spacer 120 exposed to the source/drain trench (e.g., ST in FIG. 13).

Figure 15:
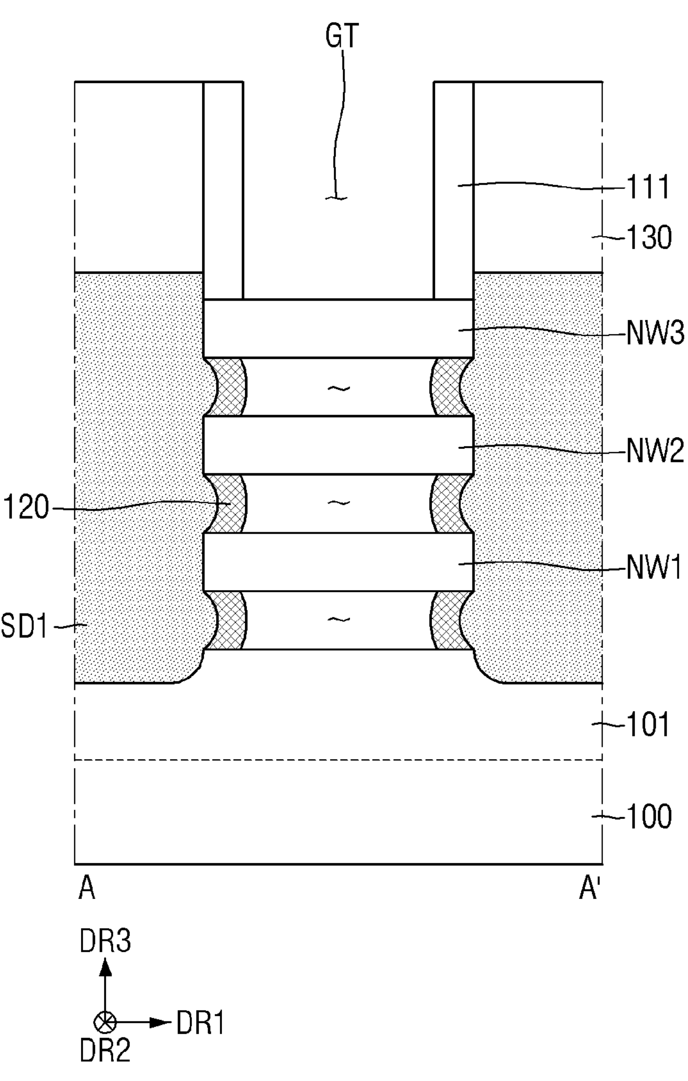
Figure 16:
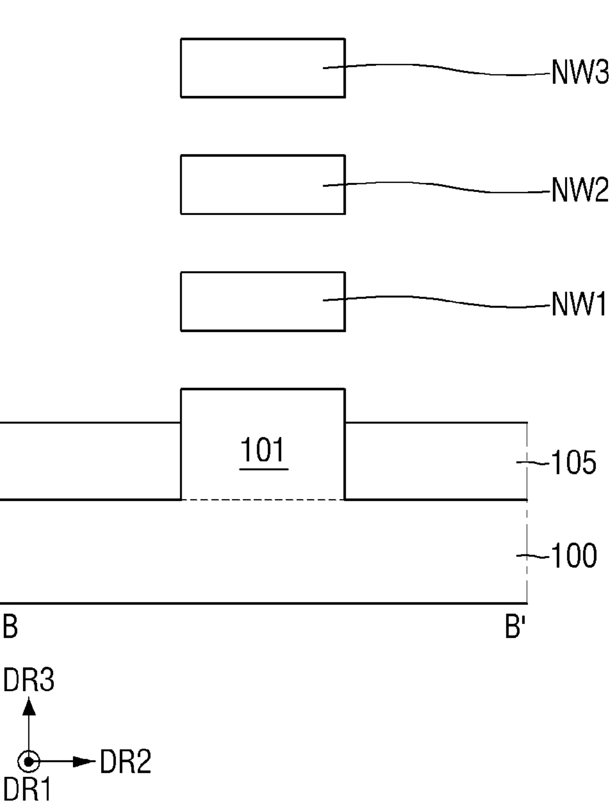

Referring to FIG. 15 and FIG. 16, the first interlayer insulating layer 130 may be formed to cover each of the source/drain region SD1, the gate spacer 111 and the dummy capping pattern (e.g., DC in FIG. 14). Subsequently, an upper surface of the dummy gate (e.g., DG in FIG. 14) may be exposed via a planarization process. Subsequently, each of the dummy gate (e.g., DG in FIG. 14) and the pad oxide layer (e.g., 20 of FIG. 14) and the sacrificial layer (e.g., 11 in FIG. 14) may be removed. A space obtained via the removal of the dummy gate (e.g., DG in FIG. 14) may be defined as the gate trench GT.

Figure 17:
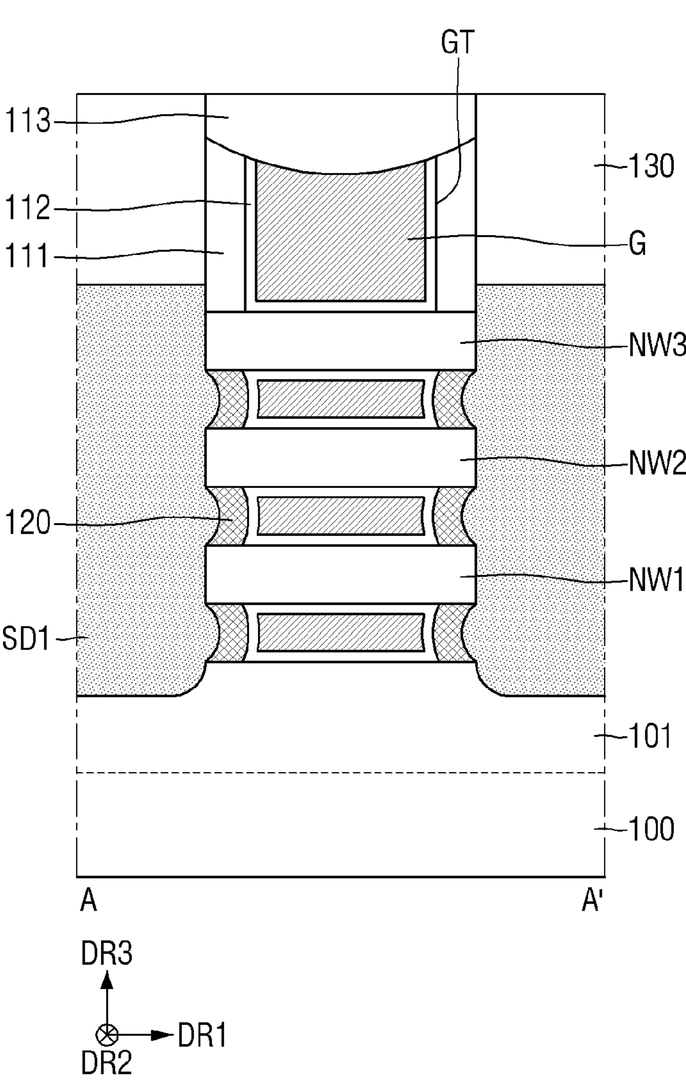
Figure 18:
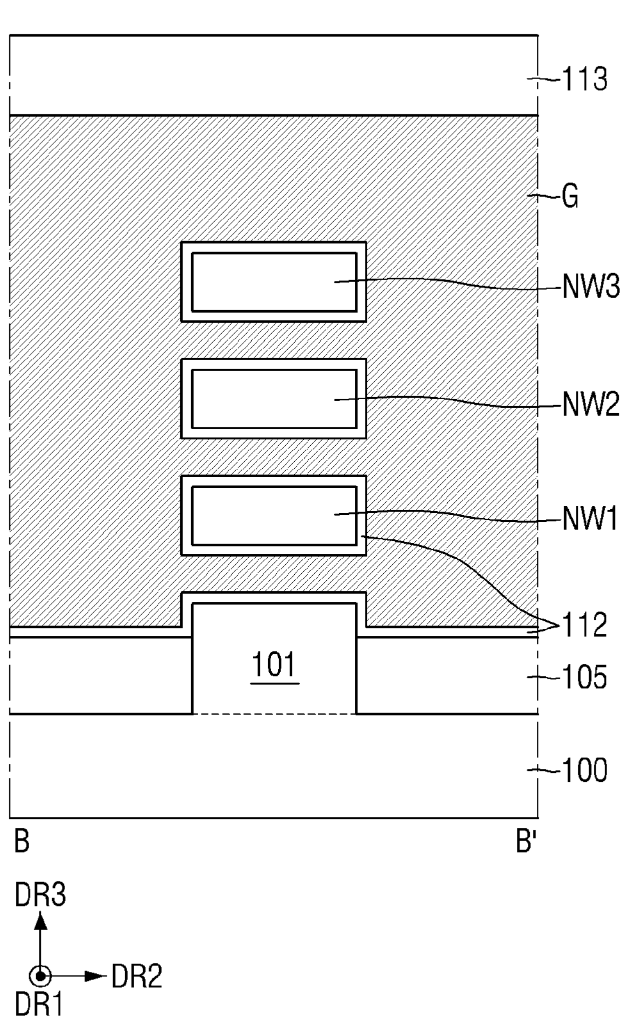

Referring to FIG. 17 and FIG. 18, the gate insulating layer 112 may be formed in a space obtained via the removal of each of the dummy gate (e.g., DG in FIG. 14), the pad oxide layer (e.g., 20 in FIG. 14) and the sacrificial layer (e.g., 11 in FIG. 14). For example, the gate insulating layer 112 may be formed conformally. Subsequently, the gate electrode G may be formed on the gate insulating layer 112. The gate electrode G may be formed on the gate insulating layer 112 and received in the gate trench GT. Further, the gate electrode G may surround each of the first to third nanosheets NW1, NW2, and NW3.

Subsequently, a portion of each of the gate spacer 111, the gate insulating layer 112, and the gate electrode G may be etched. Subsequently, the capping pattern 113 may be formed in a space obtained via removal of a top portion of each of the gate spacer 111, the gate insulating layer 112, and the gate electrode G. For example, an upper surface of the capping pattern 113 may be coplanar with an upper surface of the first interlayer insulating layer 130. However, the example embodiments are not limited thereto.

Referring to FIG. 2 to FIG. 4, the gate contact CB extending through the capping pattern 113 in the vertical direction DR3 and then connected to the gate electrode G may be formed. Subsequently, the etch stop layer 140 and the second interlayer insulating layer 150 may be sequentially formed on each of the first interlayer insulating layer 130, the capping pattern 113 and the gate contact CB. Subsequently, the via V that extends through the second interlayer insulating layer 150 and the etch stop layer 140 in the vertical direction DR3 and then is connected to the gate contact CB may be formed. In this manufacturing process, the semiconductor device as shown in FIG. 2 to FIG. 4 may be manufactured.

Hereinafter, a semiconductor device according to some example embodiments of the inventive concepts will be described with reference to FIG. 19 and FIG. 20. The following descriptions will be based on differences thereof from the semiconductor device as shown in FIG. 1 to FIG. 4.

Figure 19:
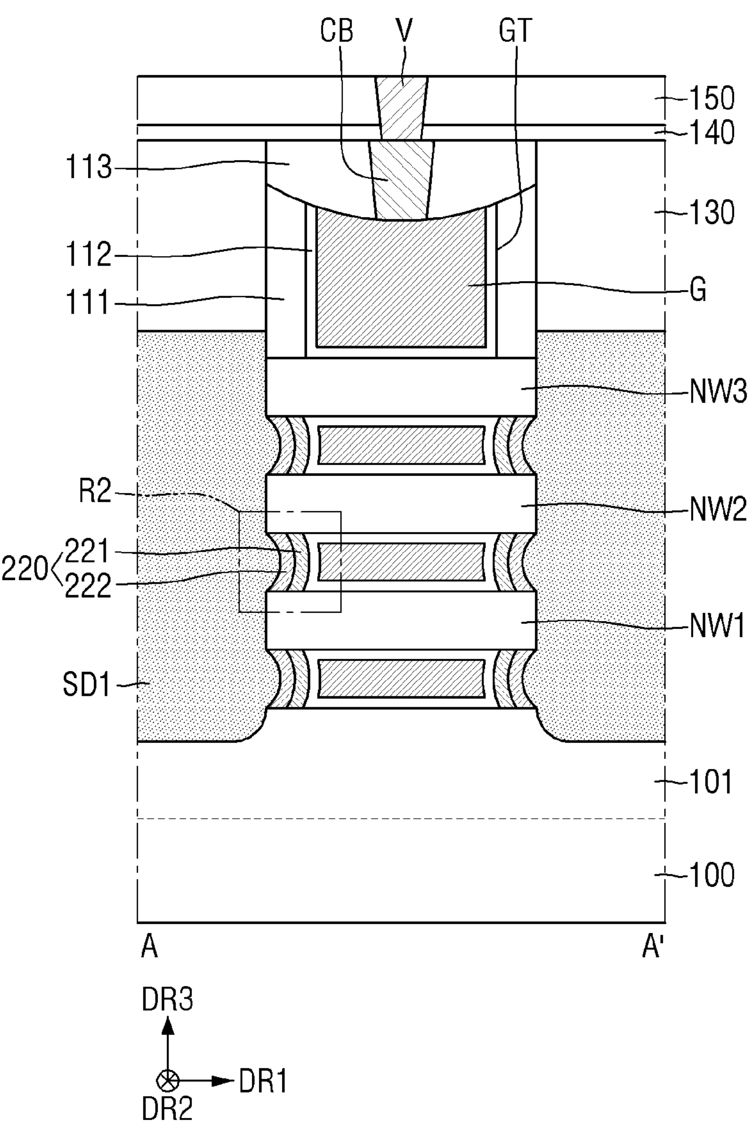
FIG. 19 is a cross-sectional view for illustrating a semiconductor device according to another example embodiment of the inventive concepts.

FIG. 19 is a cross-sectional view for illustrating a semiconductor device according to some example embodiments of the inventive concepts. FIG. 20 is an enlarged view of the R2 region of FIG. 19.

Figure 20:
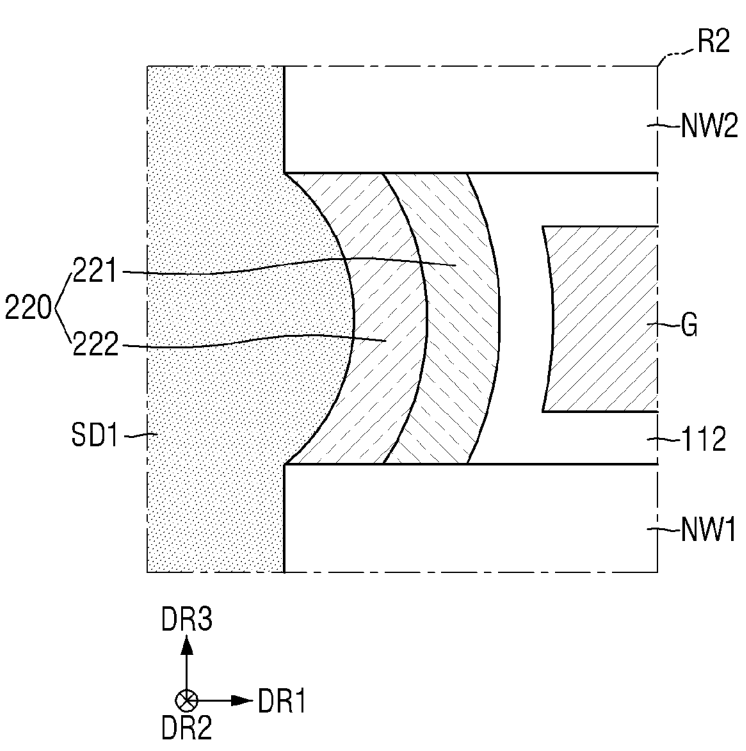
FIG. 20 is an enlarged view of a R2 region of FIG. 19.

Referring to FIG. 19 and FIG. 20, in the semiconductor device according to some example embodiments of the inventive concepts, an inner spacer 220 may be formed as a double layer.

For example, the inner spacer 220 may include a first layer 221 disposed on a sidewall of the gate electrode G and a second layer 222 disposed on the first layer 221. That is, the first layer 221 may be disposed between the gate electrode G and the source/drain region SD1. Further, the second layer 222 may be disposed between the first layer 221 and the source/drain region SD1.

A first sidewall of the first layer 221 may be in contact with the gate insulating layer 112. A second sidewall of the first layer 221 opposite the first sidewall of the first layer 221 in the first horizontal direction DR1 may contact the second layer 222. A first sidewall of the second layer 222 may contact the second sidewall of the first layer 221. A second sidewall of the second layer 222 opposite the first sidewall of the second layer 222 in the first horizontal direction DR1 may contact the source/drain region SD1.

For example, a bottom surface of the first layer 221 may be in contact with an upper surface of the active pattern 101, and an upper surface of each of the first and second nanosheets NW1 and NW2. An upper surface of the first layer 221 may contact a bottom surface of each of the first to third nanosheets NW1, NW2, and NW3. Further, a bottom surface of the second layer 222 may contact an upper surface of the active pattern 101, and an upper surface of each of the first and second nanosheets NW1 and NW2. An upper surface of the second layer 222 may contact a bottom surface of each of the first to third nanosheets NW1, NW2, and NW3.

The first layer 221 and the second layer 222 may include different materials. For example, the first layer 221 may include one of crystalline silicon nitride (SiN) or crystalline silicon oxynitride (SiON). Further, the second layer 222 may include crystalline aluminum nitride (AlN). In some example embodiments, the first layer 221 may include crystalline aluminum nitride (AlN). Further, the second layer 222 may include one of crystalline silicon nitride (SiN) or crystalline silicon oxynitride (SiON).

Hereinafter, a semiconductor device according to some example embodiments of the inventive concepts will be described with reference to FIG. 21 and FIG. 22. The following descriptions will be based on differences thereof from the semiconductor device as shown in FIG. 1 to FIG. 4.

Figure 21:
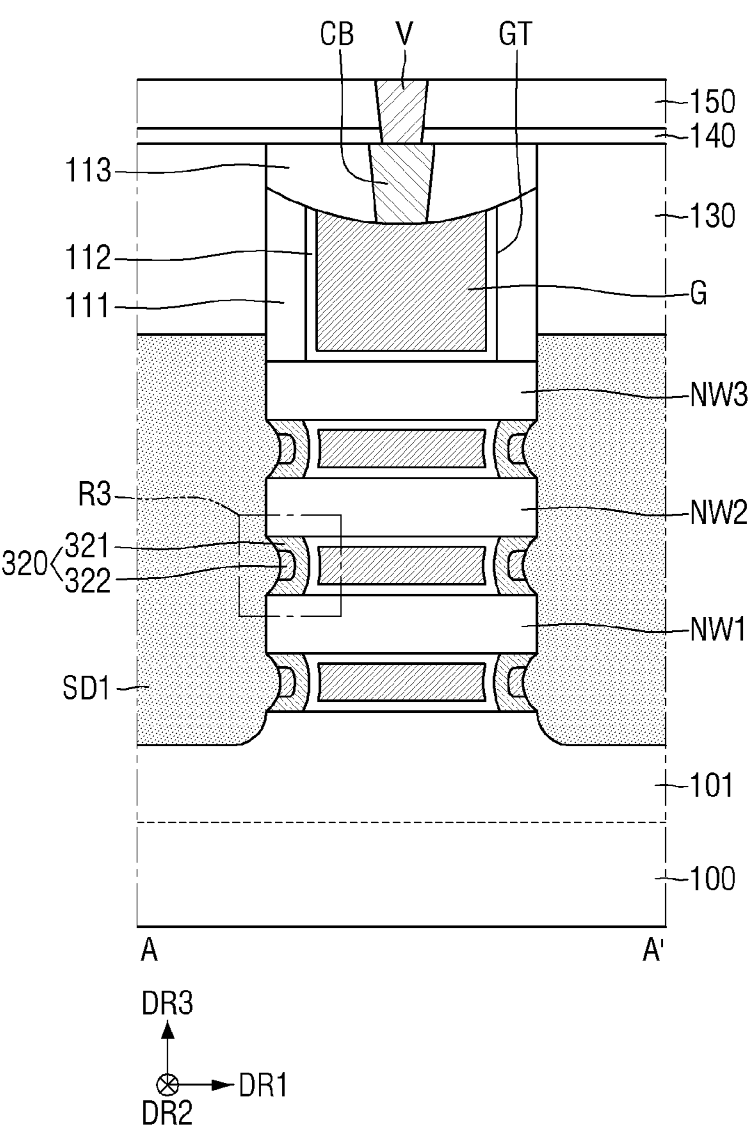
FIG. 21 is a cross-sectional view for illustrating a semiconductor device according to still another example embodiment of the inventive concepts.

FIG. 21 is a cross-sectional view for illustrating a semiconductor device according to some example embodiments of the inventive concepts. FIG. 22 is an enlarged view of the R3 region of FIG. 21.

Figure 22:
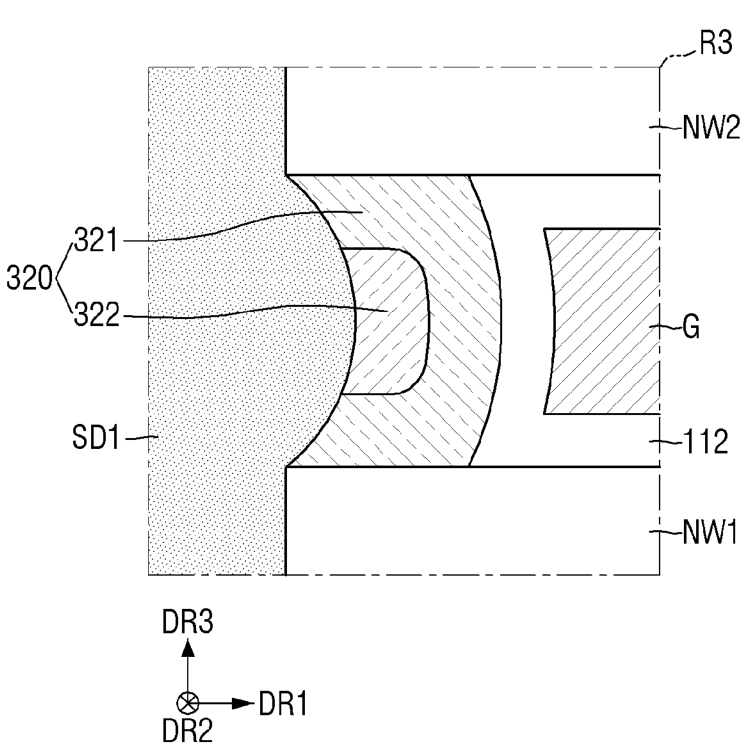
FIG. 22 is an enlarged view of a R3 region of FIG. 21.

Referring to FIG. 21 and FIG. 22, in the semiconductor device according to some example embodiments of the inventive concepts, an inner spacer 320 may be formed as a double layer.

For example, the inner spacer 320 may include a first layer 321 disposed on a sidewall of the gate electrode G and a second layer 322 disposed on the first layer 321. That is, the first layer 321 may be disposed between the gate electrode G and the source/drain region SD1. Further, the second layer 322 may be disposed between the first layer 321 and the source/drain region SD1.

The first layer 321 may be formed on both opposing sidewalls of the gate electrode G, and may be formed along each of a sidewall of the gate insulating layer 112, an upper surface of the active pattern 101, a bottom surface and an upper surface of the first nanosheet NW1, a bottom surface and an upper surface of the second nanosheet NW2, and a bottom surface of the third nanosheet NW3. That is, the first layer 321 may contact each of the sidewall of the gate insulating layer 112, the upper surface of the active pattern 101, the bottom surface and the upper surface of the first nanosheet NW1, the bottom surface and the upper surface of the second nanosheet NW2, and the bottom surface of the third nanosheet NW3. Further, the first layer 321 may contact the source/drain region SD1.

Each of a first sidewall, a bottom surface and an upper surface of the second layer 322 may be surrounded with the first layer 321. That is, each of the first sidewall, the bottom surface and the upper surface of the second layer 322 may contact the first layer 321. A second sidewall of the second layer 322 opposite the first sidewall of the second layer 322 in the first horizontal direction DR1 may contact the source/drain region SD1. The second layer 322 does not contact each of the active pattern 101, and the first to third nanosheets NW1, NW2, and NW3.

The first layer 321 and the second layer 322 may include different materials. For example, the first layer 321 may include one of crystalline silicon nitride (SiN) or crystalline silicon oxynitride (SiON). Further, the second layer 222 may include crystalline aluminum nitride (AlN).

Hereinafter, a semiconductor device according to some example embodiments of the inventive concepts will be described with reference to FIG. 23 and FIG. 24. The following descriptions will be based on differences thereof from the semiconductor device as shown in FIG. 1 and FIG. 4.

Figure 23:
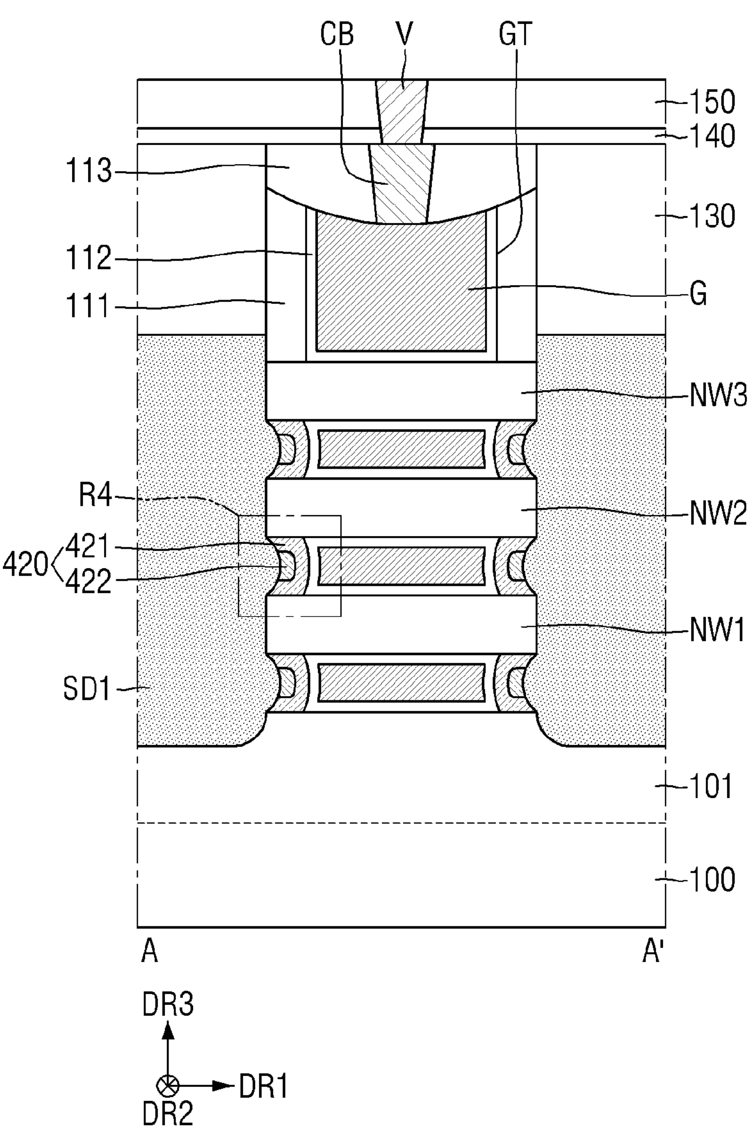
FIG. 23 is a cross-sectional view for illustrating a semiconductor device according to yet another example embodiment of the inventive concepts.

FIG. 23 is a cross-sectional view for illustrating a semiconductor device according to some example embodiments of the inventive concepts. FIG. 24 is an enlarged view of the R4 region of FIG. 23.

Figure 24:
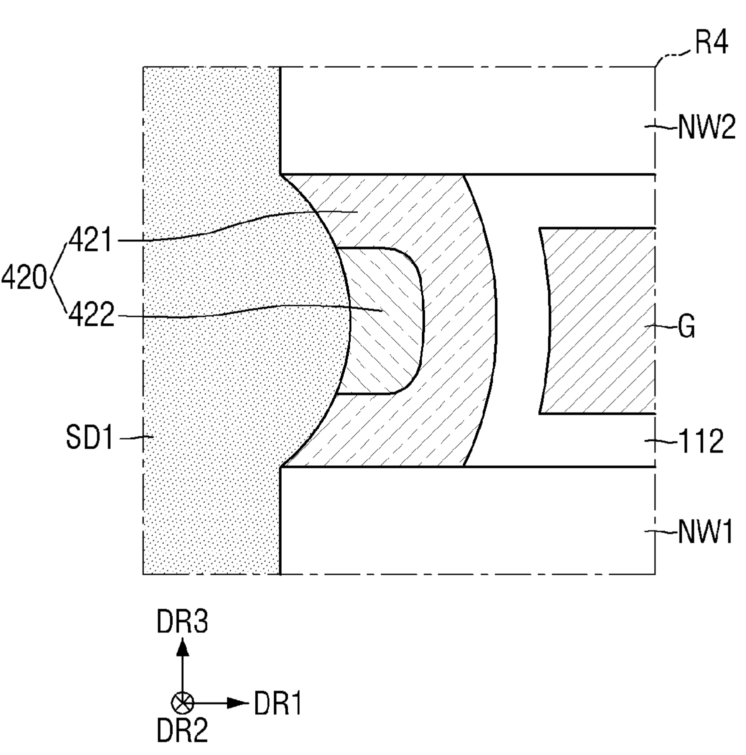
FIG. 24 is an enlarged view of a R4 region of FIG. 23.

Referring to FIG. 23 and FIG. 24, in the semiconductor device according to some example embodiments of the inventive concepts, an inner spacer 420 may be formed as a double layer.

For example, the inner spacer 420 may include a first layer 421 disposed on a sidewall of the gate electrode G and a second layer 422 disposed on the first layer 421. That is, the first layer 421 may be disposed between the gate electrode G and the source/drain region SD1. Further, the second layer 422 may be disposed between the first layer 421 and the source/drain region SD1.

The first layer 421 may be formed on each of both opposing sidewalls of the gate electrode G and may be formed along each of a sidewall of the gate insulating layer 112, an upper surface of the active pattern 101, a bottom surface and an upper surface of the first nanosheet NW1, a bottom surface and an upper surface of the second nanosheet NW2, and a bottom surface of the third nanosheet NW3. That is, the first layer 421 may contact each of the sidewall of the gate insulating layer 112, the upper surface of the active pattern 101, the bottom surface and the upper surface of the first nanosheet NW1, the bottom surface and the upper surface of the second nanosheet NW2, and the bottom surface of the third nanosheet NW3. Further, the first layer 421 may contact the source/drain region SD1.

Each of a first sidewall, a bottom surface and an upper surface of the second layer 422 may be surrounded with the first layer 421. That is, each of the first sidewall, the bottom surface and the upper surface of the second layer 422 may contact the first layer 421. The second sidewall of the second layer 422 opposite the first sidewall of the second layer 422 in the first horizontal direction DR1 may contact the source/drain region SD1. The second layer 422 is not in contact with each of the active pattern 101, and the first to third nanosheets NW1, NW2, and NW3.

The first layer 421 and the second layer 422 may include different materials. For example, the first layer 421 may include crystalline aluminum nitride (AlN). Further, the second layer 422 may include one of crystalline silicon nitride (SiN) or crystalline silicon oxynitride (SiON).

Hereinafter, a semiconductor device according to some example embodiments of the inventive concepts will be described with reference to FIG. 25 and FIG. 26. The following descriptions will be based on differences thereof from the semiconductor device as shown in FIG. 1 to FIG. 4.

Figure 25:
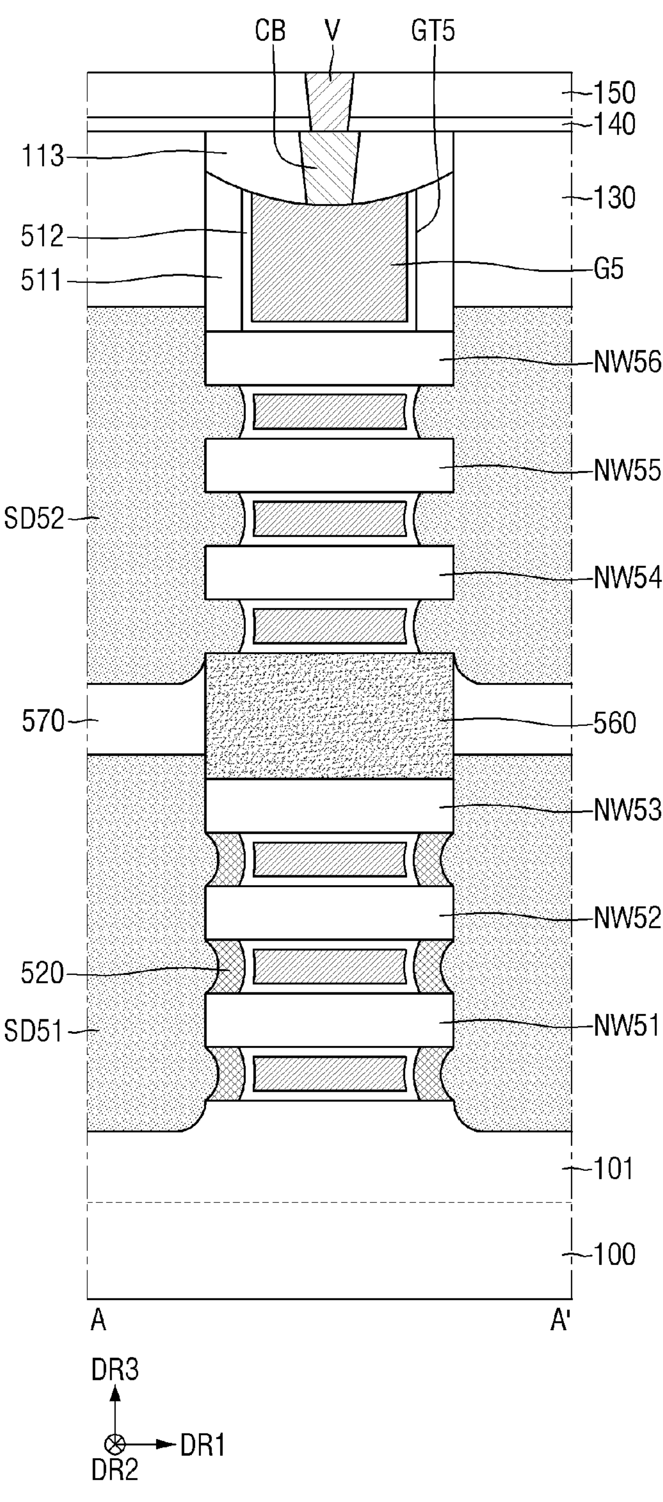
FIG. 25 and FIG. 26 are cross-sectional views for illustrating a semiconductor device according to another example embodiment of the inventive concepts.
Figure 26:
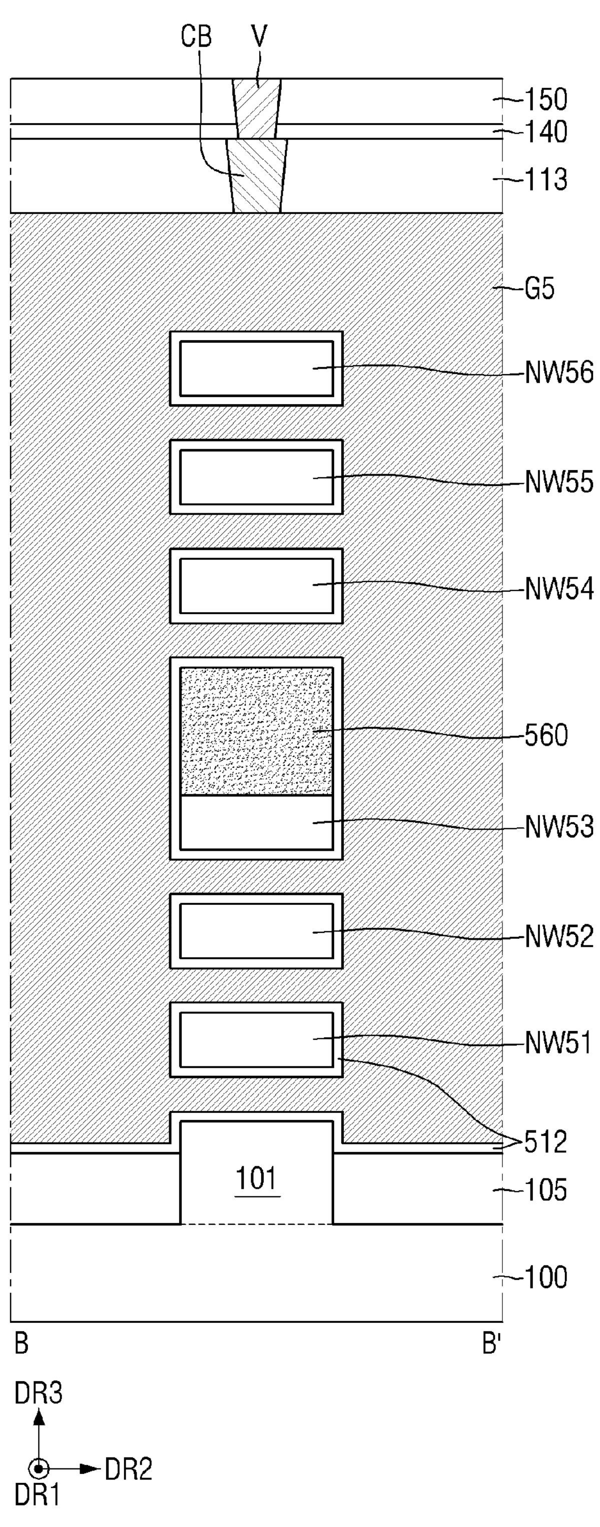

FIG. 25 and FIG. 26 are cross-sectional views for illustrating a semiconductor device according to some example embodiments of the inventive concepts.

The semiconductor device according to some example embodiments may include the substrate 100, the active pattern 101, the field insulating layer 105, a first plurality of nanosheets NW51, NW52, and NW53, an isolation layer 560, a second plurality of nanosheets NW54, NW55, and NW56, a gate electrode G5, a gate spacer 511, a gate insulating layer 512, the capping pattern 113, an inner spacer 520, a first source/drain region SD51, a second source/drain region SD52, the first interlayer insulating layer 130, the gate contact CB, the etch stop layer 140, the second interlayer insulating layer 150, the via V, and a third interlayer insulating layer 570. Hereinafter, descriptions of the components as described in FIG. 1 to FIG. 4 are omitted.

The first plurality of nanosheets NW51, NW52, and NW53 may be disposed on the active pattern 101. The first plurality of nanosheets NW51, NW52, and NW53 may include a plurality of nanosheets stacked on top of each other and spaced apart from each other in the vertical direction DR3 while being disposed on the active pattern 101. For example, the first plurality of nanosheets NW51, NW52, and NW53 may include a first nanosheet NW51, a second nanosheet NW52 and a third nanosheet NW53 that are sequentially stacked and are spaced apart from each other in the vertical direction DR3 while being disposed on the active pattern 101.

The isolation layer 560 may be disposed on the first plurality of nanosheets NW51, NW52, and NW53. That is, the isolation layer 560 may be disposed on an upper surface of the third nanosheet NW53. For example, the isolation layer 560 may contact an upper surface of the third nanosheet NW53. However, the example embodiments are not limited thereto. In some example embodiments, the isolation layer 560 may be spaced apart from the upper surface of the third nanosheet NW53 in the vertical direction DR3.

The isolation layer 560 may include, for example, at least one of silicon nitride (SiN), silicon oxycarbonitride (SiOCN), silicon boron carbonitride (SiBCN), silicon carbonitride (SiCN), silicon oxynitride (SiON), and combinations thereof.

The second plurality of nanosheets NW54, NW55, and NW56 may be disposed on the isolation layer 560. For example, the second plurality of nanosheets NW54, NW55, and NW56 may be spaced apart from the isolation layer 560 in the vertical direction DR3. However, the example embodiments are not limited thereto. In some example embodiments, the second plurality of nanosheets NW54, NW55, and NW56 may contact the isolation layer 560.

The second plurality of nanosheets NW54, NW55, and NW56 may include a plurality of nanosheets stacked on top of each other and spaced apart from each other in the vertical direction DR3 while being disposed on the isolation layer 560. For example, the second plurality of nanosheets NW54, NW55, and NW56 may include a fourth nanosheet NW54, a fifth nanosheet NW55 and a sixth nanosheet NW56 that are sequentially stacked on top of each other and spaced apart from each other in the vertical direction DR3 while being disposed on the isolation layer 560.

For example, each of both opposing sidewalls in the first horizontal direction DR1 of the isolation layer 560 may be aligned with each of both opposing sidewalls in the first horizontal direction DR1 of each of the first plurality of nanosheets NW51, NW52, and NW53 and each of both opposing sidewalls in the horizontal direction DR1 of each of the second plurality of nanosheets NW54, NW55, and NW56 in the vertical direction DR3. Further, each of both opposing sidewalls in the second horizontal direction DR2 of the isolation layer 560 may be aligned with each of both opposing sidewalls in the second horizontal direction DR2 of each of the first plurality of nanosheets NW51, NW52, NW53 and each of both opposing sidewalls in the second horizontal direction DR2 of each of the second plurality of nanosheets NW54, NW55, and NW56 in the vertical direction DR3. However, the example embodiments are not limited thereto.

FIG. 25 and FIG. 26 illustrate that each of the first plurality of nanosheets NW51, NW52, and NW53 and the second plurality of nanosheets NW54, NW55, and NW56 includes three nanosheets stacked on top of each other and spaced apart from each other in the vertical direction DR3. However, this is for the convenience of illustration, and the example embodiments are not limited thereto. In some example embodiments, each of the first plurality of nanosheets NW51, NW52, and NW53 and the second plurality of nanosheets NW54, NW55, and NW56 may include four or more nanosheets stacked on top of each other and spaced apart from each other in the vertical direction DR3.

The gate spacer 511 may extend in the second horizontal direction DR2 while being disposed on the sixth nanosheet NW56 as the uppermost nanosheet among the second plurality of nanosheets NW54, NW55, and NW56 and the field insulating layer 105. The gate spacer 511 may include two spacers spaced apart from each other in the first horizontal direction DR1. A gate trench GT5 may be defined between the two spacers of the gate spacer 511.

The gate electrode G5 may extend in the second horizontal direction DR2 while being disposed on the active pattern 101 and the field insulating layer 105. The gate electrode G5 may be received inside the gate trench GT5. Further, the gate electrode G5 may surround each of the first plurality of nanosheets NW51, NW52, and NW53, the isolation layer 560 and the second plurality of nanosheets NW54, NW55, and NW56.

FIG. 26 illustrates that one gate electrode G5 surrounds all of the first plurality of nanosheets NW51, NW52, and NW53 and the second plurality of nanosheets NW54, NW55, and NW56. However, the example embodiments are not limited thereto. In some example embodiments, the first plurality of nanosheets NW51, NW52, and NW53 and the second plurality of nanosheets NW54, NW55, and NW56 may be surrounded with different gate electrodes. In some example embodiments, the gate electrode surrounding the second plurality of nanosheets NW54, NW55, and NW56 may be spaced apart from the gate electrode surrounding the first plurality of nanosheets NW51, NW52, and NW53 in the vertical direction DR3.

The first source/drain region SD51 may be disposed on each of both opposing sidewalls in the first horizontal direction DR1 of each of the first plurality of nanosheets NW51, NW52, and NW53 while being disposed on the active pattern 101. The second source/drain region SD52 may be disposed on each of both opposing sidewalls in the first horizontal direction DR1 of each of the second plurality of nanosheets NW54, NW55, and NW56 while being disposed on the first source/drain region SD51. The second source/drain region SD52 may be spaced apart from the first source/drain region SD51 in the vertical direction DR3.

The third interlayer insulating layer 570 may be disposed between the first source/drain region SD51 and the second source/drain region SD52. The third interlayer insulating layer 570 may contact each of both opposing sidewalls in the first horizontal direction DR1 of the isolation layer 560. The third interlayer insulating layer 570 may include, for example, at least one of silicon oxide, silicon nitride, silicon oxynitride, and a low-k material.

The gate insulating layer 512 may be disposed along a sidewall and a bottom surface of the gate trench GT5. That is, the gate insulating layer 512 may be disposed between the gate electrode G5 and the gate spacer 511 while being received inside the gate trench GT5. The gate insulating layer 512 may be disposed between the gate electrode G5 and the field insulating layer 105. The gate insulating layer 512 may be disposed between the gate electrode G5 and the first plurality of nanosheets NW51, NW52, and NW53. The gate insulating layer 512 may be disposed between the gate electrode G5 and the second plurality of nanosheets NW54, NW55, and NW56. The gate insulating layer 512 may be disposed between the gate electrode G5 and the isolation layer 560. The gate insulating layer 512 may be disposed between the gate electrode G5 and the active pattern 101. The gate insulating layer 512 may be disposed between the gate electrode G5 and the first source/drain region SD51. The gate insulating layer 512 may be disposed between the gate electrode G5 and the second source/drain region SD52.

The inner spacer 520 may be disposed between adjacent ones of the first plurality of nanosheets NW51, NW52, and NW53. For example, the inner spacers 520 may be disposed between the active pattern 101 and the first nanosheet NW51, between the first nanosheet NW51 and the second nanosheet NW52, and between the second nanosheet NW52 and the third nanosheet NW53, respectively. The inner spacer 520 may be disposed on each of both opposing side surfaces in the first horizontal direction DR1 of the gate electrode G5. The inner spacer 520 may be disposed between the gate insulating layer 512 and the first source/drain region SD51.

The inner spacer is not disposed between adjacent ones of the second plurality of nanosheets NW54, NW55, and NW56. That is, the second source/drain region SD52 may contact a portion of the gate insulating layer 512 between adjacent ones of the second plurality of nanosheets NW54, NW55, and NW56.

The inner spacer 520 may include at least one of crystalline aluminum nitride (AlN), crystalline silicon nitride (SiN), and crystalline silicon oxynitride (SiON). Although it is illustrated in FIG. 25 that the inner spacer 520 is formed as a single film, example embodiments are not limited thereto. In some example embodiments, the inner spacer 520 may be formed as two layers including different materials.

Hereinafter, a semiconductor device according to some example embodiments of the inventive concepts will be described with reference to FIG. 27. The following descriptions will be based on differences thereof from the semiconductor device as shown in FIG. 25 and FIG. 26.

Figure 27:
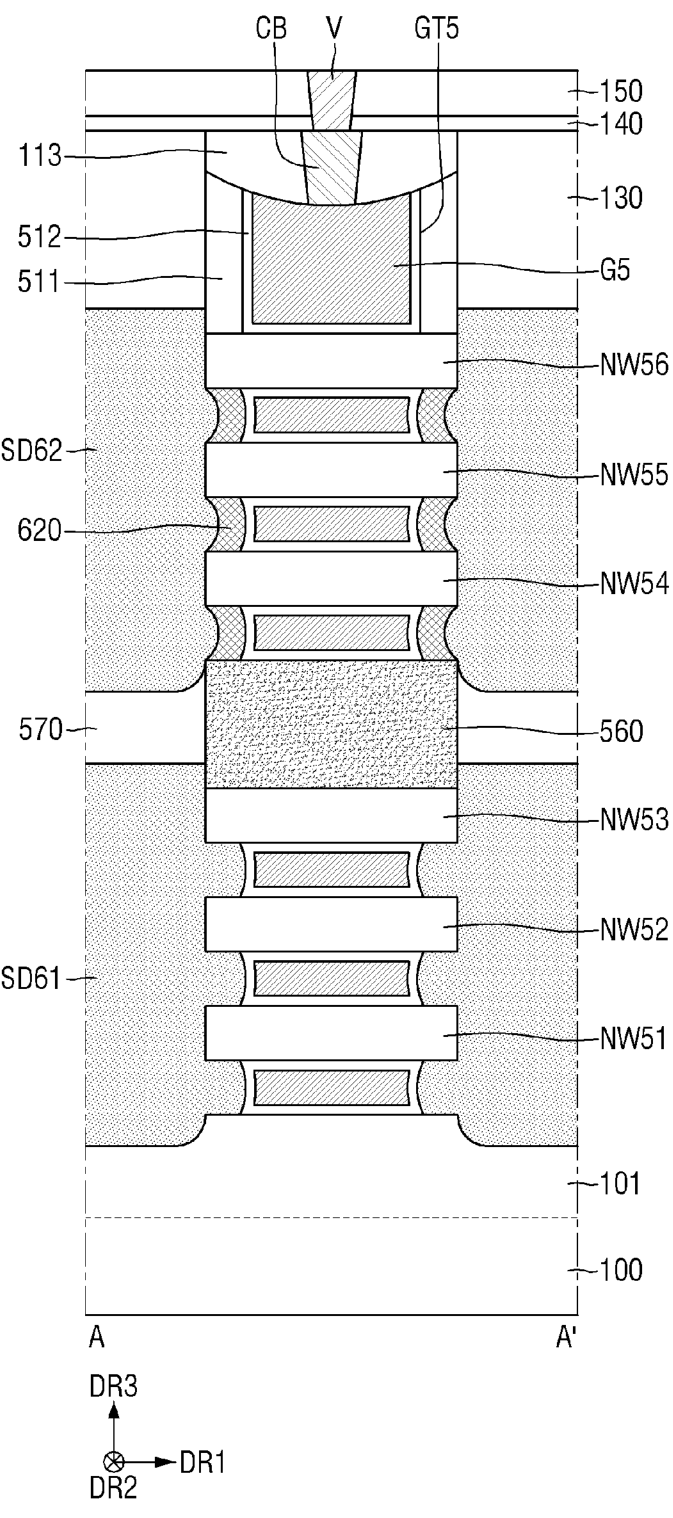
FIG. 27 is a cross-sectional view for illustrating a semiconductor device according to still another example embodiment of the inventive concepts.

FIG. 27 is a cross-sectional view for illustrating a semiconductor device according to some example embodiments of the inventive concepts.

Referring to FIG. 27, in the semiconductor device according to some example embodiments of the inventive concepts, an inner spacer 620 may be disposed between adjacent ones of the second plurality of nanosheets NW54, NW55, and NW56.

For example, the inner spacers 620 may be disposed between the isolation layer 560 and the fourth nanosheet NW54, between the fourth nanosheet NW54 and the fifth nanosheet NW55, and between the fifth nanosheet NW55 and the sixth nanosheet NW56, respectively. The inner spacer 620 may be disposed on each of both opposing side surfaces in the first horizontal direction DR1 of the gate electrode G5. The inner spacer 620 may be disposed between the gate insulating layer 512 and the second source/drain region SD62.

The inner spacer is not disposed between adjacent ones of the first plurality of nanosheets NW51, NW52, and NW53. That is, the first source/drain region SD61 may contact a portion of the gate insulating layer 512 between adjacent ones of the first plurality of nanosheets NW51, NW52, and NW53.

The inner spacer 620 may include at least one of crystalline aluminum nitride (AlN), crystalline silicon nitride (SiN), and crystalline silicon oxynitride (SiON). Although it is illustrated in FIG. 27 that the inner spacer 620 is formed as a single film, the example embodiments are not limited thereto. In some example embodiments, the inner spacer 620 may be formed as two layers including different materials.

Hereinafter, a semiconductor device according to some example embodiments of the inventive concepts will be described with reference to FIG. 28. The following descriptions will be based on differences thereof from the semiconductor device as shown in FIG. 25 and FIG. 26.

Figure 28:
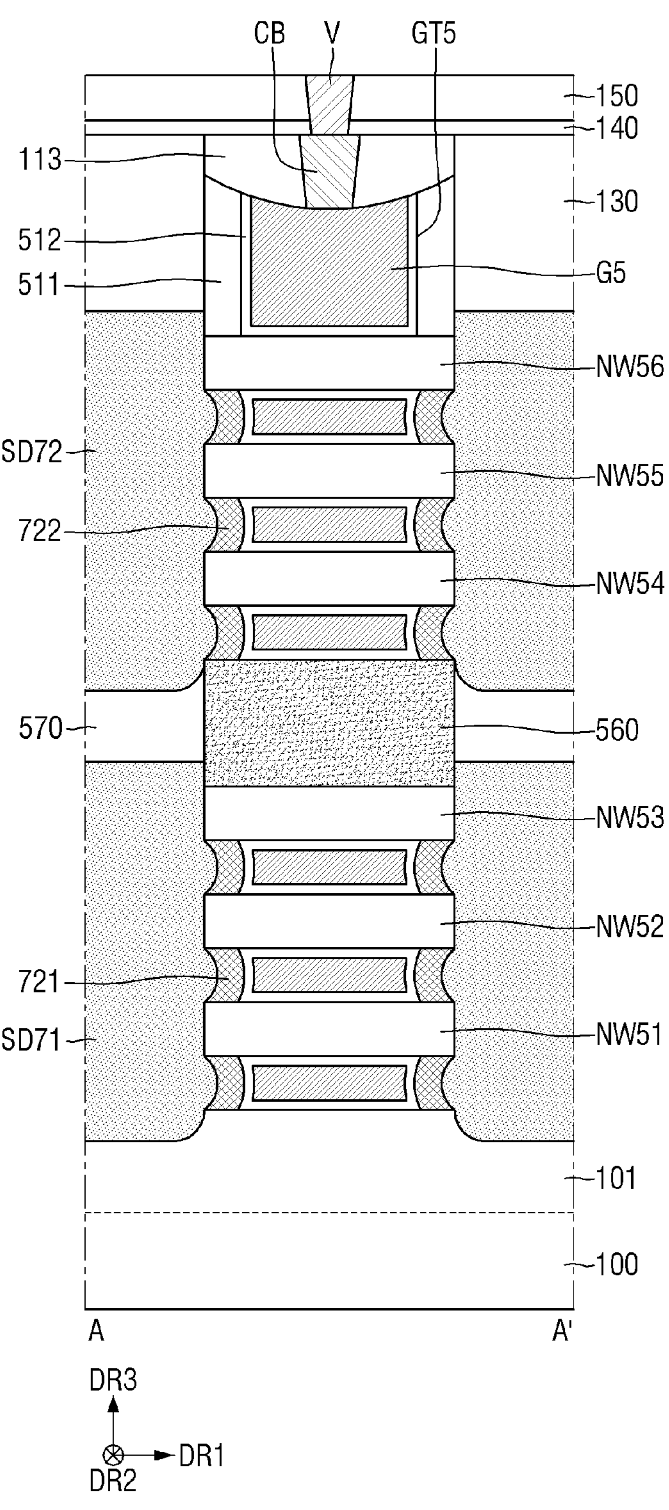
FIG. 28 is a cross-sectional view for illustrating a semiconductor device according to yet another example embodiment of the inventive concepts.

FIG. 28 is a cross-sectional view for illustrating a semiconductor device according to some example embodiments of the inventive concepts.

Referring to FIG. 28, in the semiconductor device according to some example embodiments of the inventive concepts, a first inner spacer 721 may be disposed between adjacent ones of the first plurality of nanosheets NW51, NW52, and NW53. Further, a second inner spacer 722 may be disposed between adjacent ones of the second plurality of nanosheets NW54, NW55, and NW56.

For example, the first inner spacer 721 may be disposed between the active pattern 101 and the first nanosheet NW51, between the first nanosheet NW51 and the second nanosheet NW52, between the second nanosheet NW52 and the third nanosheet NW53, respectively. The first inner spacer 721 may be disposed between the gate insulating layer 512 and the first source/drain region SD71. Further, the second inner spacers 722 may be disposed between the isolation layer 560 and the fourth nanosheet NW54, between the fourth nanosheet NW54 and the fifth nanosheet NW55, and between the fifth nanosheet NW55 and the sixth nanosheet NW56, respectively. The second inner spacer 722 may be disposed between the gate insulating layer 512 and the second source/drain region SD72.

Each of the first and the second inner spacers 721 and 722 may include at least one of crystalline aluminum nitride (AlN), crystalline silicon nitride (SiN), and crystalline silicon oxynitride (SiON). In FIG. 28, each of the first and the second inner spacers 721 and 722 is illustrated to be formed as a single film, but the example embodiments are not limited thereto. In some example embodiments, the first inner spacer 721 may be formed as two layers including different materials. Further, the second inner spacer 722 may be formed as two layers including different materials.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

Although example embodiments according to the inventive concepts have been described above with reference to the accompanying drawings, the inventive concepts are not limited to the example embodiments and may be implemented in various different forms. The skilled person in the art will be able to appreciate that the example embodiments may be implemented in other specific forms without changing the technical spirit or characteristics of the inventive concepts. Therefore, it should be understood that the example embodiments as described above are not restrictive but are illustrative in all respects.

What is claimed is:

1. A semiconductor device comprising:

a substrate;

an active pattern on the substrate, the active pattern extending in a first horizontal direction;

a first plurality of nanosheets on the active pattern, the first plurality of nanosheets stacked and spaced apart from each other in a vertical direction;

a gate electrode on the active pattern, the gate electrode extending in a second horizontal direction different from the first horizontal direction, and the gate electrode surrounding the first plurality of nanosheets; and an inner spacer on at least one side surface of the gate electrode, the inner spacer between adjacent ones of the first plurality of nanosheets, and the inner spacer including a crystalline insulating material.

2. The semiconductor device of claim 1, wherein the inner spacer includes crystalline aluminum nitride (AlN).

3. The semiconductor device of claim 1, wherein the inner spacer includes crystalline silicon nitride (SiN) or crystalline silicon oxynitride (SiON).

4. The semiconductor device of claim 1, wherein the inner spacer is a single film.

5. The semiconductor device of claim 1, wherein the inner spacer includes:

a first layer on a sidewall of the gate electrode; and a second layer on the first layer, the first layer and the second layer including different materials.

6. The semiconductor device of claim 5, wherein the first layer includes crystalline silicon nitride (SiN) or crystalline silicon oxynitride (SiON), and the second layer includes crystalline aluminum nitride (AlN).

7. The semiconductor device of claim 6, wherein each of the first layer and the second layer is in contact with the first plurality of nanosheets.

8. The semiconductor device of claim 5, wherein
the first layer is in contact with the first plurality of nanosheets, and
the second layer does not contact the first plurality of nanosheets.

9. The semiconductor device of claim 5, wherein
the first layer includes crystalline aluminum nitride (AlN), and
the second layer includes crystalline silicon nitride (SiN) or crystalline silicon oxynitride (SiON).

10. The semiconductor device of claim 1, further comprising:
an isolation layer on an upper surface of the first plurality of nanosheets; and
a second plurality of nanosheets on an upper surface of the isolation layer, the second plurality of nanosheets stacked and spaced apart from each other in the vertical direction.

11. The semiconductor device of claim 1, further comprising:
an isolation layer under the first plurality of nanosheets; and
a second plurality of nanosheets between the active pattern and the isolation layer, the second plurality of nanosheets stacked and spaced apart from each other in the vertical direction.

12. A semiconductor device comprising:
a substrate;
an active pattern on the substrate, the active pattern extending in a first horizontal direction;
a plurality of nanosheets on the active pattern, the plurality of nanosheets stacked and spaced apart from each other in a vertical direction;
a source/drain region on at least one side surface of the plurality of nanosheets; and
an inner spacer contacting the source/drain region between adjacent ones of the plurality of nanosheets, the inner spacer including a crystalline insulating material.

13. The semiconductor device of claim 12, wherein the inner spacer includes crystalline aluminum nitride (AlN).

14. The semiconductor device of claim 12, wherein the inner spacer includes crystalline silicon nitride (SiN) or crystalline silicon oxynitride (SiON).

15. The semiconductor device of claim 12, further comprising a gate electrode on the active pattern and extending in a second horizontal direction different from the first horizontal direction, the gate electrode surrounding the plurality of nanosheets,
wherein the inner spacer includes
a first layer between the gate electrode and the source/drain region, and
a second layer between the first layer and the source/drain region, the second layer in contact with the source/drain region, and the first layer and the second layer including different materials.

16. The semiconductor device of claim 15, wherein
the first layer includes crystalline silicon nitride (SiN) or crystalline silicon oxynitride (SiON), and
the second layer includes crystalline aluminum nitride (AlN).

17. The semiconductor device of claim 15, wherein
the first layer includes crystalline aluminum nitride (AlN), and
the second layer includes crystalline silicon nitride (SiN) or crystalline silicon oxynitride (SiON).

18. A semiconductor device comprising:
a substrate;
an active pattern on the substrate, the active pattern extending in a first horizontal direction;
a plurality of nanosheets on the active pattern, the plurality of nanosheets stacked and spaced apart from each other in a vertical direction;
a gate electrode on the active pattern, the gate electrode extending in a second horizontal direction different from the first horizontal direction, and the gate electrode surrounding the plurality of nanosheets;
a source/drain region on at least one side surface of the gate electrode; and
an inner spacer between the gate electrode and the source/drain region, the inner spacer contacting the source/drain region, and the inner spacer including crystalline aluminum nitride (AlN).

19. The semiconductor device of claim 18, wherein the inner spacer is a single film.

20. The semiconductor device of claim 18, wherein the inner spacer includes:
a first layer between the gate electrode and the source/drain region; and
a second layer between the first layer and the source/drain region, the second layer in contact with the source/drain region, and the first layer and the second layer including different materials.

* * * * *